(12) United States Patent
Paz et al.

(10) Patent No.: US 12,356,409 B2
(45) Date of Patent: Jul. 8, 2025

(54) MULTI-LEVEL CODING FOR UPLINK TRANSMISSIONS

(71) Applicant: QUALCOMM Incorporated, San Diego, CA (US)

(72) Inventors: Daniel Paz, Geva Carmel (IL); Idan Michael Horn, Hod Hasharon (IL); Shay Landis, Hod Hasharon (IL); Michael Levitsky, Rehovot (IL)

(73) Assignee: QUALCOMM Incorporated, San Diego, CA (US)

( * ) Notice: Subject to any disclaimer, the term of this patent is extended or adjusted under 35 U.S.C. 154(b) by 253 days.

(21) Appl. No.: 17/809,691

(22) Filed: Jun. 29, 2022

(65) Prior Publication Data

US 2024/0008042 A1 Jan. 4, 2024

(51) Int. Cl.
| | |
|---|---|
| *H04W 72/21* | (2023.01) |
| *H04L 1/24* | (2006.01) |
| *H04L 27/34* | (2006.01) |
| *H04W 72/51* | (2023.01) |
| *H04W 72/53* | (2023.01) |

(52) U.S. Cl.
CPC ............. *H04W 72/21* (2023.01); *H04L 1/246* (2013.01); *H04L 27/34* (2013.01); *H04W 72/51* (2023.01); *H04W 72/53* (2023.01)

(58) Field of Classification Search
None
See application file for complete search history.

(56) References Cited

U.S. PATENT DOCUMENTS

| | | | | |
|---|---|---|---|---|
| 2008/0137413 | A1* | 6/2008 | Kong | G11C 11/5628 365/185.03 |
| 2019/0200348 | A1* | 6/2019 | Chae | H04L 5/0007 |
| 2022/0038204 | A1* | 2/2022 | Sugiyama | H04L 1/0003 |

FOREIGN PATENT DOCUMENTS

| | | |
|---|---|---|
| WO | 2022120299 A1 | 6/2022 |
| WO | 2023113975 | 6/2023 |

OTHER PUBLICATIONS

International Search Report and Written Opinion—PCT/US2023/023839—ISA/EPO—Sep. 15, 2023.
Jieun O., et al., "Performance Comparison of Multi-Level Coding Schemes for Flash Memory", 2018 IEEE International Conference on Consumer Electronics—Asia (ICCE-Asia), XP033457812, DOI: 10.1109/ICCE-ASIA.2018.8552109, Jun. 24, 2018, 4 Pages, abstract.

* cited by examiner

*Primary Examiner* — Donald L Mills
(74) *Attorney, Agent, or Firm* — Harrity & Harrity, LLP

(57) ABSTRACT

Various aspects of the present disclosure generally relate to wireless communication. In some aspects, a user equipment (UE) may transmit an indication of a multi-level coding (MLC) capability for uplink transmissions. The UE may receive a configuration of a selected MLC scheme associated with an uplink transmission, wherein the configuration of the selected MLC scheme is based at least in part on the indication of the MLC capability for the uplink transmissions. Numerous other aspects are described.

30 Claims, 13 Drawing Sheets

800

810 — Transmit an indication of an MLC capability for uplink transmissions

820 — Receive a configuration of a selected MLC scheme associated with an uplink transmission, wherein the configuration of the selected MLC scheme is based at least in part on the indication of the MLC capability for the uplink transmissions

MULTI-LEVEL CODING FOR UPLINK TRANSMISSIONS

FIELD OF THE DISCLOSURE

Aspects of the present disclosure generally relate to wireless communication and to techniques and apparatuses for multi-level coding for uplink transmissions.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more network nodes that support communication for wireless communication devices, such as a user equipment (UE) or multiple UEs. A UE may communicate with a network node via downlink communications and uplink communications. "Downlink" (or "DL") refers to a communication link from the network node to the UE, and "uplink" (or "UL") refers to a communication link from the UE to the network node. Some wireless networks may support device-to-device communication, such as via a local link (e.g., a sidelink (SL), a wireless local area network (WLAN) link, and/or a wireless personal area network (WPAN) link, among other examples).

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

Some aspects described herein relate to a method of wireless communication performed by a user equipment (UE). The method may include transmitting an indication of a multi-level coding (MLC) capability for uplink transmissions. The method may include receiving a configuration of a selected MLC scheme associated with an uplink transmission, wherein the configuration of the selected MLC scheme is based at least in part on the indication of the MLC capability for the uplink transmissions.

Some aspects described herein relate to a method of wireless communication performed by a network node. The method may include receiving an indication of an MLC capability for uplink transmissions. The method may include transmitting a configuration of a selected MLC scheme associated with an uplink transmission, wherein the configuration of the selected MLC scheme is based at least in part on the indication of the MLC capability for the uplink transmissions.

Some aspects described herein relate to an apparatus for wireless communication at a UE. The apparatus may include a memory and one or more processors coupled to the memory. The one or more processors may be configured to transmit an indication of an MLC capability for uplink transmissions. The one or more processors may be configured to receive a configuration of a selected MLC scheme associated with an uplink transmission, wherein the configuration of the selected MLC scheme is based at least in part on the indication of the MLC capability for the uplink transmissions.

Some aspects described herein relate to an apparatus for wireless communication at a network node. The apparatus may include a memory and one or more processors coupled to the memory. The one or more processors may be configured to receive an indication of an MLC capability for uplink transmissions. The one or more processors may be configured to transmit a configuration of a selected MLC scheme associated with an uplink transmission, wherein the configuration of the selected MLC scheme is based at least in part on the indication of the MLC capability for the uplink transmissions.

Some aspects described herein relate to a non-transitory computer-readable medium that stores a set of instructions for wireless communication by a UE. The set of instructions, when executed by one or more processors of the UE, may cause the UE to transmit an indication of an MLC capability for uplink transmissions. The set of instructions, when executed by one or more processors of the UE, may cause the UE to receive a configuration of a selected MLC scheme associated with an uplink transmission, wherein the configuration of the selected MLC scheme is based at least in part on the indication of the MLC capability for the uplink transmissions.

Some aspects described herein relate to a non-transitory computer-readable medium that stores a set of instructions for wireless communication by a network node. The set of instructions, when executed by one or more processors of the network node, may cause the network node to receive an indication of an MLC capability for uplink transmissions. The set of instructions, when executed by one or more processors of the network node, may cause the network node to transmit a configuration of a selected MLC scheme associated with an uplink transmission, wherein the configuration of the selected MLC scheme is based at least in part on the indication of the MLC capability for the uplink transmissions.

Some aspects described herein relate to an apparatus for wireless communication. The apparatus may include means for transmitting an indication of an MLC capability for uplink transmissions. The apparatus may include means for receiving a configuration of a selected MLC scheme associated with an uplink transmission, wherein the configuration of the selected MLC scheme is based at least in part on the indication of the MLC capability for the uplink transmissions.

Some aspects described herein relate to an apparatus for wireless communication. The apparatus may include means for receiving an indication of an MLC capability for uplink transmissions. The apparatus may include means for transmitting a configuration of a selected MLC scheme associated with an uplink transmission, wherein the configuration of the selected MLC scheme is based at least in part on the indication of the MLC capability for the uplink transmissions.

Aspects generally include a method, apparatus, system, computer program product, non-transitory computer-readable medium, user equipment, base station, network entity, network node, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

Figure 1:
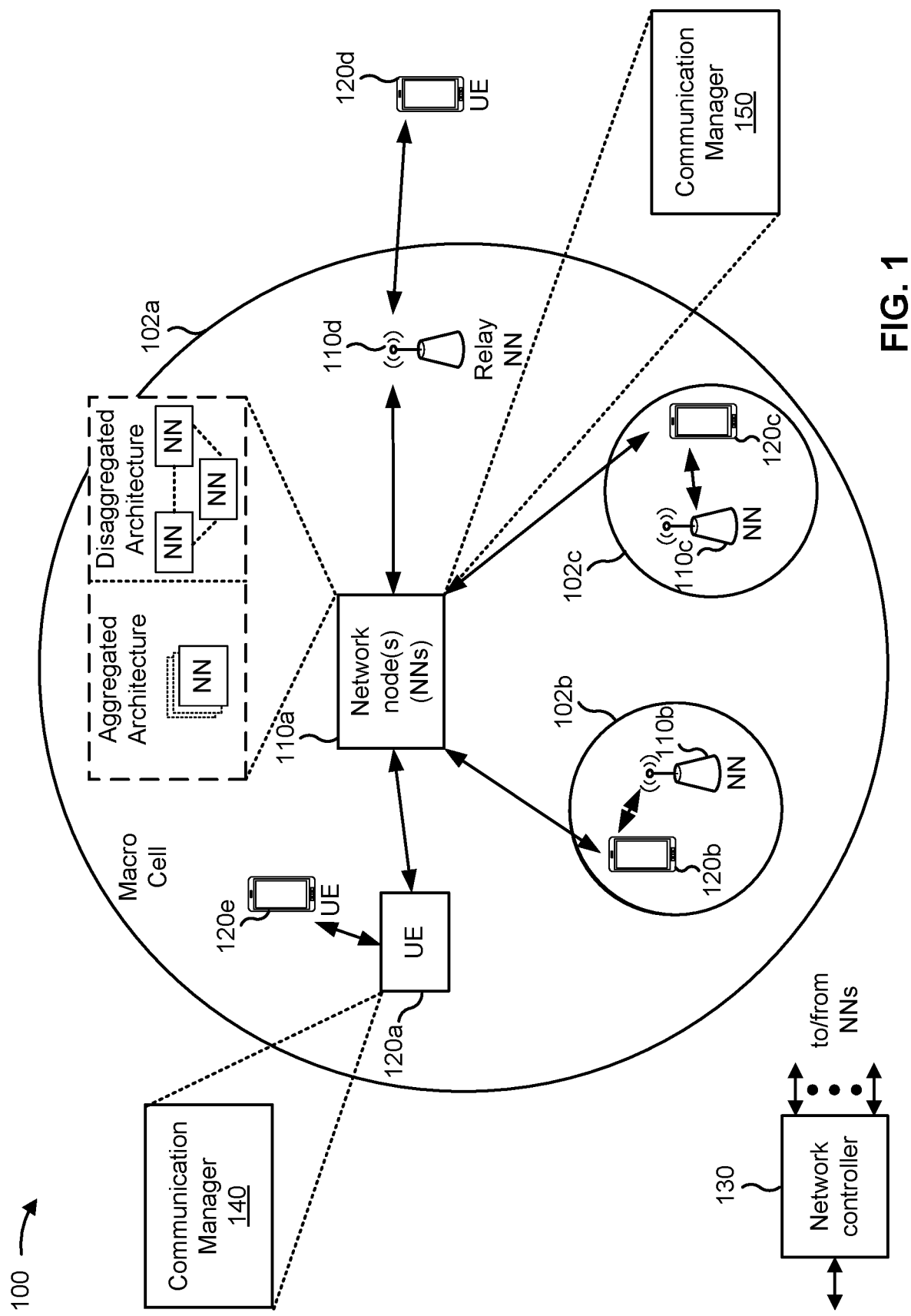
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more network nodes 110 (shown as a network node 110a, a network node 110b, a network node 110c, and a network node 110d), a user equipment (UE) 120 or multiple UEs 120 (shown as a UE 120a, a UE 120b, a UE 120c, a UE 120d, and a UE 120e), and/or other entities. A network node 110 is a network node that communicates with UEs 120. As shown, a network node 110 may include one or more network nodes. For example, a network node 110 may be an aggregated network node, meaning that the aggregated network node is configured to utilize a radio protocol stack that is physically or logically integrated within a single radio access network (RAN) node (e.g., within a single device or unit). As another example, a network node 110 may be a disaggregated network node (sometimes referred to as a disaggregated base station), meaning that the network node 110 is configured to utilize a protocol stack that is physically or logically distributed among two or more nodes (such as one or more central units (CUs), one or more distributed units (DUs), or one or more radio units (RUs)).

In some examples, a network node 110 is or includes a network node that communicates with UEs 120 via a radio access link, such as an RU. In some examples, a network node 110 is or includes a network node that communicates with other network nodes 110 via a fronthaul link or a midhaul link, such as a DU. In some examples, a network node 110 is or includes a network node that communicates with other network nodes 110 via a midhaul link or a core network via a backhaul link, such as a CU. In some examples, a network node 110 (such as an aggregated network node 110 or a disaggregated network node 110) may include multiple network nodes, such as one or more RUs, one or more CUs, and/or one or more DUs. A network node 110 may include, for example, an NR base station, an LTE base station, a Node B, an eNB (e.g., in 4G), a gNB (e.g., in 5G), an access point, a transmission reception point (TRP), a DU, an RU, a CU, a mobility element of a network, a core network node, a network element, a network equipment, a RAN node, or a combination thereof. In some examples, the network nodes 110 may be interconnected to one another or to one or more other network nodes 110 in the wireless network 100 through various types of fronthaul, midhaul, and/or backhaul interfaces, such as a direct physical connection, an air interface, or a virtual network, using any suitable transport network.

In some examples, a network node 110 may provide communication coverage for a particular geographic area. In the Third Generation Partnership Project (3GPP), the term "cell" can refer to a coverage area of a network node 110 and/or a network node subsystem serving this coverage area, depending on the context in which the term is used. A network node 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscriptions. A femto cell may cover a relatively small geographic area (e.g., a home) and may allow restricted access by UEs 120 having association with the femto cell (e.g., UEs 120 in a closed subscriber group (CSG)). A network node 110 for a macro cell may be referred to as a macro network node. A network node 110 for a pico cell may be referred to as a pico network node. A network node 110 for a femto cell may be referred to as a femto network node or an in-home network node. In the example shown in FIG. 1, the network node 110a may be a macro network node for a macro cell 102a, the network node 110b may be a pico network node for a pico cell 102b, and the network node 110c may be a femto network node for a femto cell 102c. A network node may support one or multiple (e.g., three) cells. In some examples, a cell may not necessarily be stationary, and the geographic area of the cell may move according to the location of a network node 110 that is mobile (e.g., a mobile network node).

In some aspects, the term "base station" or "network node" may refer to an aggregated base station, a disaggregated base station, an integrated access and backhaul (IAB) node, a relay node, or one or more components thereof. For example, in some aspects, "base station" or "network node" may refer to a CU, a DU, an RU, a Near-Real Time (Near-RT) RAN Intelligent Controller (RIC), or a Non-Real Time (Non-RT) RIC, or a combination thereof. In some aspects, the term "base station" or "network node" may refer to one device configured to perform one or more functions, such as those described herein in connection with the network node 110. In some aspects, the term "base station" or "network node" may refer to a plurality of devices configured to perform the one or more functions. For example, in some distributed systems, each of a quantity of different devices (which may be located in the same geographic location or in different geographic locations) may be configured to perform at least a portion of a function, or to duplicate performance of at least a portion of the function, and the term "base station" or "network node" may refer to any one or more of those different devices. In some aspects, the term "base station" or "network node" may refer to one or more virtual base stations or one or more virtual base station functions. For example, in some aspects, two or more base station functions may be instantiated on a single device. In some aspects, the term "base station" or "network node" may refer to one of the base station functions and not another. In this way, a single device may include more than one base station.

The wireless network 100 may include one or more relay stations. A relay station is a network node that can receive a transmission of data from an upstream node (e.g., a network node 110 or a UE 120) and send a transmission of the data to a downstream node (e.g., a UE 120 or a network node 110). A relay station may be a UE 120 that can relay transmissions for other UEs 120. In the example shown in FIG. 1, the network node 110d (e.g., a relay network node) may communicate with the network node 110a (e.g., a macro network node) and the UE 120d in order to facilitate communication between the network node 110a and the UE 120d. A network node 110 that relays communications may be referred to as a relay station, a relay base station, a relay network node, a relay node, a relay, or the like.

The wireless network 100 may be a heterogeneous network that includes network nodes 110 of different types, such as macro network nodes, pico network nodes, femto network nodes, relay network nodes, or the like. These different types of network nodes 110 may have different transmit power levels, different coverage areas, and/or different impacts on interference in the wireless network 100. For example, macro network nodes may have a high transmit power level (e.g., 5 to 40 watts) whereas pico network nodes, femto network nodes, and relay network nodes may have lower transmit power levels (e.g., 0.1 to 2 watts).

A network controller 130 may couple to or communicate with a set of network nodes 110 and may provide coordination and control for these network nodes 110. The network controller 130 may communicate with the network nodes 110 via a backhaul communication link or a midhaul communication link. The network nodes 110 may communicate with one another directly or indirectly via a wireless or wireline backhaul communication link. In some aspects, the network controller 130 may be a CU or a core network device, or may include a CU or a core network device.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, a UE function of a network node, and/or any other suitable device that is configured to communicate via a wireless or wired medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a network node, another device (e.g., a remote device), or some other entity. Some UEs 120 may be considered Internet-of-Things (IoT) devices, and/or may be implemented as NB-IoT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120a and UE 120e) may communicate directly using one or more sidelink channels (e.g., without using a network node 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the network node 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, the UE 120 may include a communication manager 140. As described in more detail elsewhere herein, the communication manager 140 may transmit an indication of a multi-level coding (MLC) capability for uplink transmissions; and receive a configuration of a selected MLC scheme associated with an uplink transmission, wherein the configuration of the selected MLC scheme is based at least in part on the indication of the MLC capability for the uplink transmissions. Additionally, or alternatively, the communication manager 140 may perform one or more other operations described herein.

In some aspects, the network node 110 may include a communication manager 150. As described in more detail elsewhere herein, the communication manager 150 may receive an indication of an MLC capability for uplink transmissions; and transmit a configuration of a selected MLC scheme associated with an uplink transmission, wherein the configuration of the selected MLC scheme is based at least in part on the indication of the MLC capability for the uplink transmissions. Additionally, or alternatively, the communication manager 150 may perform one or more other operations described herein.

As indicated above, FIG. 1 is provided as an example. Other examples may differ from what is described with regard to FIG. 1.

Figure 2:
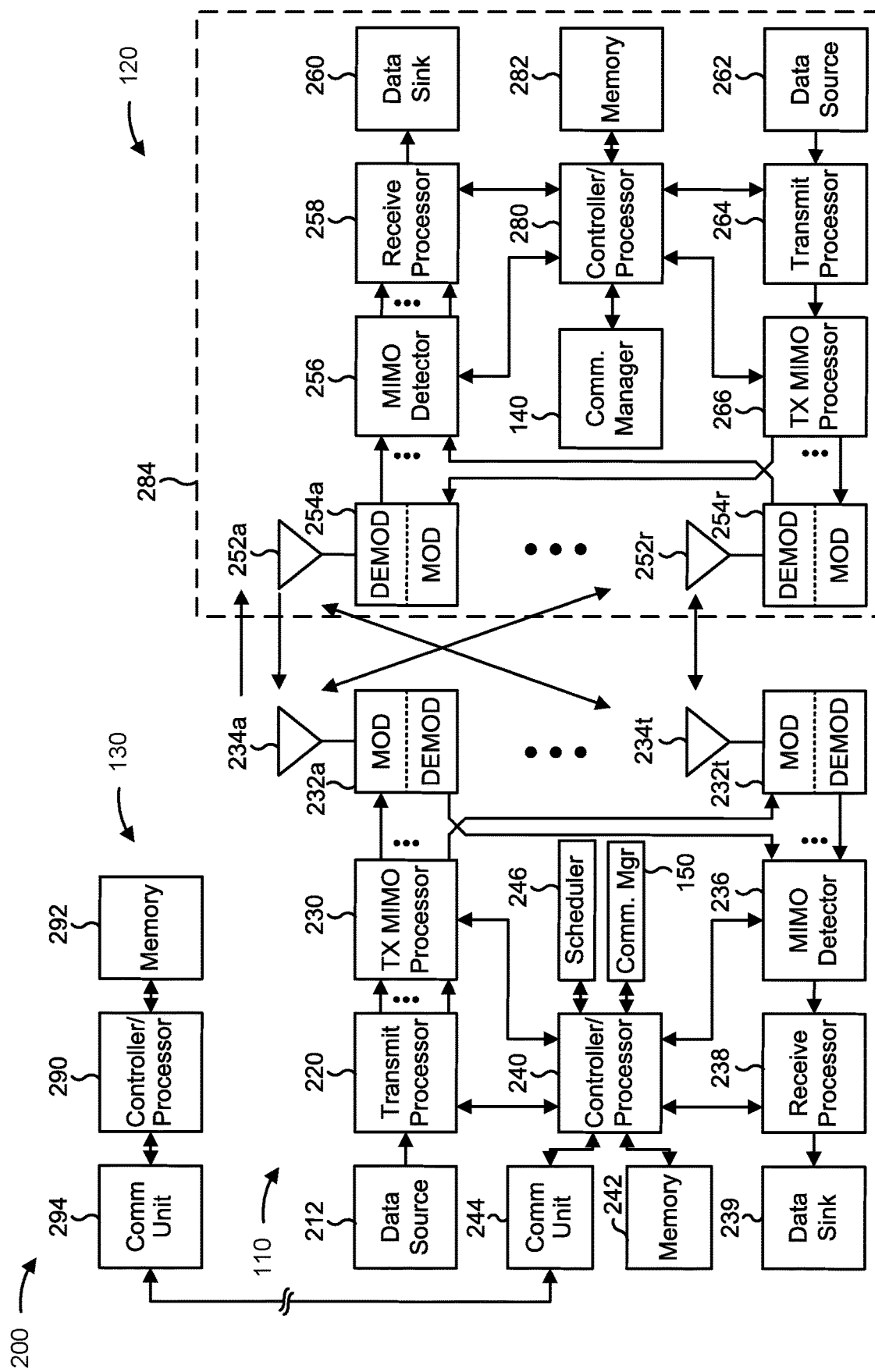
FIG. 2 is a diagram illustrating an example of a network node in communication with a user equipment (UE) in a wireless network, in accordance with the present disclosure.

FIG. 2 is a diagram illustrating an example 200 of a network node 110 in communication with a user equipment (UE) 120 in a wireless network 100, in accordance with the present disclosure. The network node 110 may be equipped with a set of antennas 234a through 234t, such as T antennas (T≥1). The UE 120 may be equipped with a set of antennas 252a through 252r, such as R antennas (R≥1). The network node 110 of example 200 includes one or more radio frequency components, such as antennas 234 and a modem 254. In some examples, a network node 110 may include an interface, a communication component, or another component that facilitates communication with the UE 120 or another network node. Some network nodes 110 may not include radio frequency components that facilitate direct communication with the UE 120, such as one or more CUs, or one or more DUs.

At the network node 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The network node 110 may process (e.g., encode and modulate) the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the network node 110 and/or other network nodes 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the network node 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the network node 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 5A-11).

At the network node 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The network node 110 may include a communication unit 244 and may communicate with the network controller 130 via the communication unit 244. The network node 110 may include a scheduler 246 to schedule one or more UEs 120 for downlink and/or uplink communications. In some examples, the modem 232 of the network node 110 may include a modulator and a demodulator. In some examples, the network node 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 5A-11).

The controller/processor 240 of the network node 110, the controller/processor 280 of the UE 120, and/or any other component(s) of FIG. 2 may perform one or more techniques associated with MLC for uplink transmissions, as described in more detail elsewhere herein. For example, the controller/processor 240 of the network node 110, the controller/processor 280 of the UE 120, and/or any other component(s) of FIG. 2 may perform or direct operations of, for example, process 800 of FIG. 8, process 900 of FIG. 9, and/or other processes as described herein. The memory 242 and the memory 282 may store data and program codes for the network node 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the network node 110 and/or the UE 120, may cause the one or more processors, the UE 120, and/or the network node 110 to perform or direct operations of, for example, process 800 of FIG. 8, process 900 of FIG. 9, and/or other processes as described herein. In some examples, executing instructions may include running the instructions, converting the instructions, compiling the instructions, and/or interpreting the instructions, among other examples.

In some aspects, the UE 120 includes means for transmitting an indication of an MLC capability for uplink transmissions; and/or means for receiving a configuration of a selected MLC scheme associated with an uplink transmission, wherein the configuration of the selected MLC scheme is based at least in part on the indication of the MLC capability for the uplink transmissions. The means for the UE 120 to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, the network node 110 includes means for receiving an indication of an MLC capability for uplink transmissions; and/or means for transmitting a configuration of a selected MLC scheme associated with an uplink transmission, wherein the configuration of the selected MLC scheme is based at least in part on the indication of the MLC capability for the uplink transmissions. In some aspects, the means for the network node 110 to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Deployment of communication systems, such as 5G NR systems, may be arranged in multiple manners with various components or constituent parts. In a 5G NR system, or network, a network node, a network entity, a mobility element of a network, a RAN node, a core network node, a network element, a base station, or a network equipment may be implemented in an aggregated or disaggregated architecture. For example, a base station (such as a Node B (NB), an evolved NB (eNB), an NR base station, a 5G NB, an access point (AP), a TRP, or a cell, among other examples), or one or more units (or one or more components) performing base station functionality, may be implemented as an aggregated base station (also known as a standalone base station or a monolithic base station) or a disaggregated base station. "Network entity" or "network node" may refer to a disaggregated base station, or to one or more units of a disaggregated base station (such as one or more CUs, one or more DUs, one or more RUs, or a combination thereof).

An aggregated base station (e.g., an aggregated network node) may be configured to utilize a radio protocol stack that is physically or logically integrated within a single RAN node (e.g., within a single device or unit). A disaggregated base station (e.g., a disaggregated network node) may be configured to utilize a protocol stack that is physically or logically distributed among two or more units (such as one or more CUs, one or more DUs, or one or more RUs). In some examples, a CU may be implemented within a network node, and one or more DUs may be co-located with the CU, or alternatively, may be geographically or virtually distributed throughout one or multiple other network nodes. The DUs may be implemented to communicate with one or more RUs. Each of the CU, DU, and RU also can be implemented as virtual units, such as a virtual central unit (VCU), a virtual distributed unit (VDU), or a virtual radio unit (VRU), among other examples.

Base station-type operation or network design may consider aggregation characteristics of base station functionality. For example, disaggregated base stations may be utilized in an IAB network, an open radio access network (O-RAN (such as the network configuration sponsored by the O-RAN Alliance)), or a virtualized radio access network (vRAN, also known as a cloud radio access network (C-RAN)) to facilitate scaling of communication systems by separating base station functionality into one or more units that can be individually deployed. A disaggregated base station may include functionality implemented across two or more units at various physical locations, as well as functionality implemented for at least one unit virtually, which can enable flexibility in network design. The various units of the disaggregated base station can be configured for wired or wireless communication with at least one other unit of the disaggregated base station.

Figure 3:
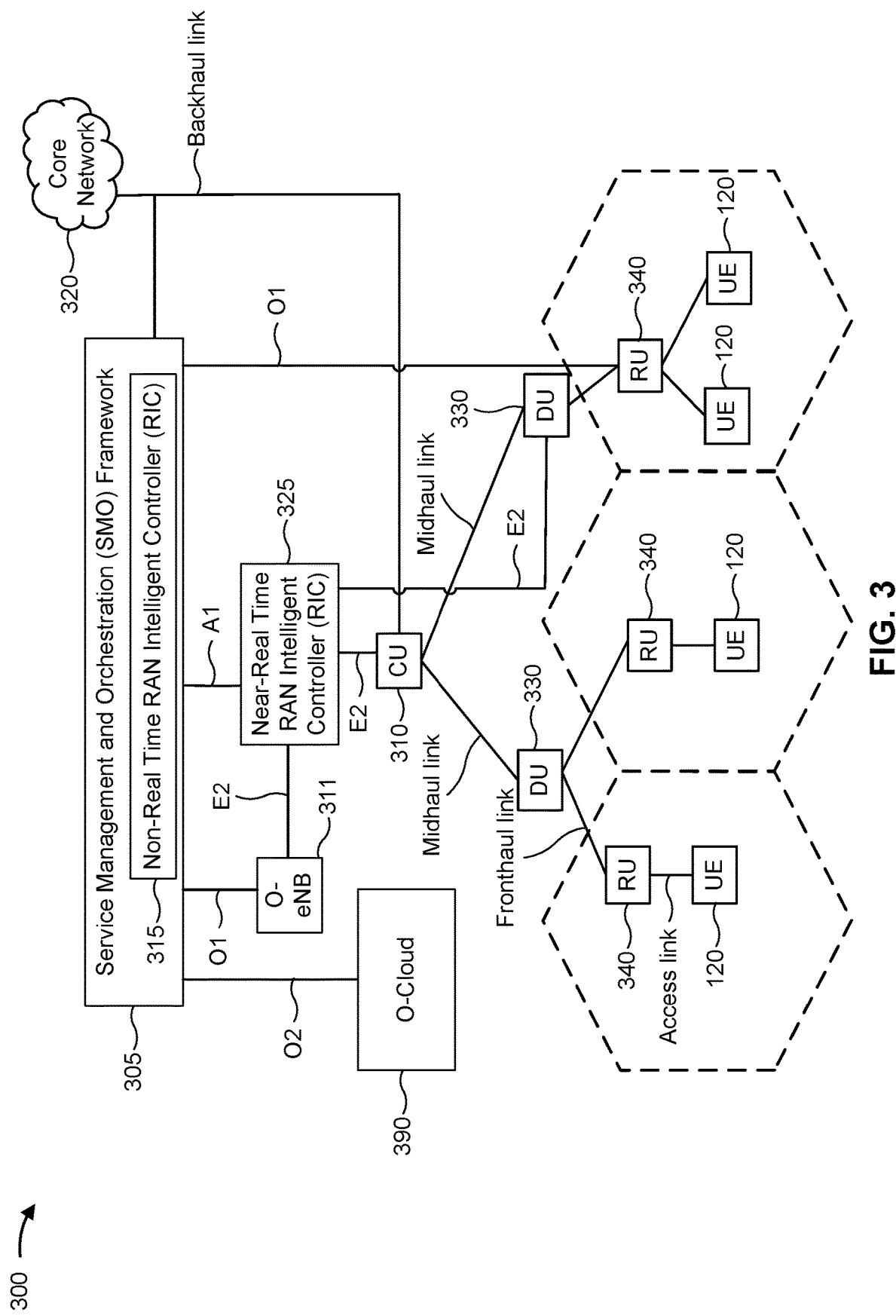
FIG. 3 is a diagram illustrating an example disaggregated base station architecture, in accordance with the present disclosure.

FIG. 3 is a diagram illustrating an example disaggregated base station architecture 300, in accordance with the present disclosure. The disaggregated base station architecture 300 may include a CU 310 that can communicate directly with a core network 320 via a backhaul link, or indirectly with the core network 320 through one or more disaggregated control units (such as a Near-RT RIC 325 via an E2 link, or a Non-RT RIC 315 associated with a Service Management and Orchestration (SMO) Framework 305, or both). A CU 310 may communicate with one or more DUs 330 via respective midhaul links, such as through F1 interfaces. Each of the DUs 330 may communicate with one or more RUs 340 via respective fronthaul links. Each of the RUs 340 may communicate with one or more UEs 120 via respective radio frequency (RF) access links. In some implementations, a UE 120 may be simultaneously served by multiple RUs 340.

Each of the units, including the CUs 310, the DUs 330, the RUs 340, as well as the Near-RT RICs 325, the Non-RT RICs 315, and the SMO Framework 305, may include one or more interfaces or be coupled with one or more interfaces configured to receive or transmit signals, data, or information (collectively, signals) via a wired or wireless transmission medium. Each of the units, or an associated processor or controller providing instructions to one or multiple communication interfaces of the respective unit, can be configured to communicate with one or more of the other units via the transmission medium. In some examples, each of the units can include a wired interface, configured to receive or transmit signals over a wired transmission medium to one or more of the other units, and a wireless interface, which may include a receiver, a transmitter or transceiver (such as an RF transceiver), configured to receive or transmit signals, or both, over a wireless transmission medium to one or more of the other units.

In some aspects, the CU 310 may host one or more higher layer control functions. Such control functions can include radio resource control (RRC) functions, packet data convergence protocol (PDCP) functions, or service data adaptation protocol (SDAP) functions, among other examples. Each control function can be implemented with an interface configured to communicate signals with other control functions hosted by the CU 310. The CU 310 may be configured to handle user plane functionality (for example, Central Unit—User Plane (CU-UP) functionality), control plane functionality (for example, Central Unit—Control Plane (CU-CP) functionality), or a combination thereof. In some implementations, the CU 310 can be logically split into one or more CU-UP units and one or more CU-CP units. A CU-UP unit can communicate bidirectionally with a CU-CP unit via an interface, such as the E1 interface when implemented in an O-RAN configuration. The CU 310 can be implemented to communicate with a DU 330, as necessary, for network control and signaling.

Each DU 330 may correspond to a logical unit that includes one or more base station functions to control the operation of one or more RUs 340. In some aspects, the DU 330 may host one or more of a radio link control (RLC) layer, a MAC layer, and one or more high physical (PHY) layers depending, at least in part, on a functional split, such as a functional split defined by the 3GPP. In some aspects, the one or more high PHY layers may be implemented by one or more modules for forward error correction (FEC) encoding and decoding, scrambling, and modulation and demodulation, among other examples. In some aspects, the DU 330 may further host one or more low PHY layers, such as implemented by one or more modules for a fast Fourier transform (FFT), an inverse FFT (iFFT), digital beamforming, or physical random access channel (PRACH) extraction and filtering, among other examples. Each layer (which also may be referred to as a module) can be implemented with an interface configured to communicate signals with other layers (and modules) hosted by the DU 330, or with the control functions hosted by the CU 310.

Each RU 340 may implement lower-layer functionality. In some deployments, an RU 340, controlled by a DU 330, may correspond to a logical node that hosts RF processing functions or low-PHY layer functions, such as performing an FFT, performing an iFFT, digital beamforming, or PRACH extraction and filtering, among other examples, based on a functional split (for example, a functional split defined by the 3GPP), such as a lower layer functional split. In such an architecture, each RU 340 can be operated to handle over the air (OTA) communication with one or more UEs 120. In some implementations, real-time and non-real-time aspects of control and user plane communication with the RU(s) 340 can be controlled by the corresponding DU 330. In some scenarios, this configuration can enable each DU 330 and the CU 310 to be implemented in a cloud-based RAN architecture, such as a vRAN architecture.

The SMO Framework 305 may be configured to support RAN deployment and provisioning of non-virtualized and virtualized network elements. For non-virtualized network elements, the SMO Framework 305 may be configured to support the deployment of dedicated physical resources for RAN coverage requirements, which may be managed via an operations and maintenance interface (such as an O1 interface). For virtualized network elements, the SMO Framework 305 may be configured to interact with a cloud computing platform (such as an open cloud (O-Cloud) platform 390) to perform network element life cycle management (such as to instantiate virtualized network elements) via a cloud computing platform interface (such as an O2 interface). Such virtualized network elements can include, but are not limited to, CUs 310, DUs 330, RUs 340, non-RT RICs 315, and Near-RT RICs 325. In some implementations, the SMO Framework 305 can communicate with a hardware aspect of a 4G RAN, such as an open eNB (O-eNB) 311, via an O1 interface. Additionally, in some implementations, the SMO Framework 305 can communicate directly with each of one or more RUs 340 via a respective O1 interface. The SMO Framework 305 also may include a Non-RT RIC 315 configured to support functionality of the SMO Framework 305.

The Non-RT RIC 315 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 325. The Non-RT RIC 315 may be coupled to or communicate with (such as via an A1 interface) the Near-RT RIC 325. The Near-RT RIC 325 may be configured to include a logical function that enables near-real-time control and optimization of RAN elements and resources via data collection and actions over an interface (such as via an E2 interface) connecting one or more CUs 310, one or more DUs 330, or both, as well as an O-eNB, with the Near-RT RIC 325.

In some implementations, to generate AI/ML models to be deployed in the Near-RT RIC 325, the Non-RT RIC 315 may receive parameters or external enrichment information from external servers. Such information may be utilized by the Near-RT RIC 325 and may be received at the SMO Framework 305 or the Non-RT RIC 315 from non-network data sources or from network functions. In some examples, the Non-RT MC 315 or the Near-RT RIC 325 may be configured to tune RAN behavior or performance. For example, the Non-RT MC 315 may monitor long-term trends and patterns for performance and employ AI/ML models to perform corrective actions through the SMO Framework 305 (such as reconfiguration via an O1 interface) or via creation of RAN management policies (such as A1 interface policies).

As indicated above, FIG. 3 is provided as an example. Other examples may differ from what is described with regard to FIG. 3.

Figure 4:
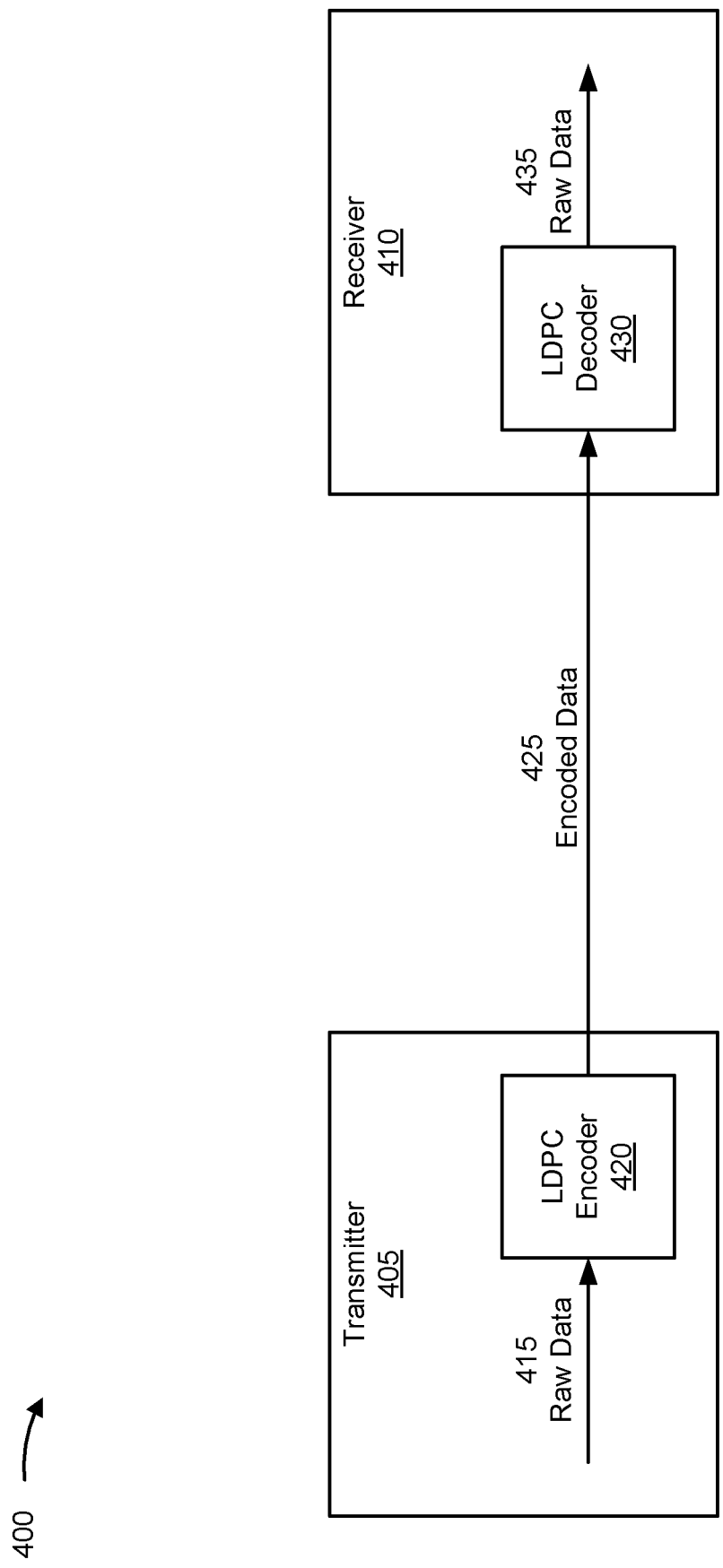
FIG. 4 is a diagram illustrating an example of a low density parity check coding procedure, in accordance with the present disclosure.

FIG. 4 is a diagram illustrating an example 400 of a low density parity check (LDPC) coding procedure, in accordance with the present disclosure.

A communication from a transmitting entity (e.g., a UE 120 or a network node 110) to a receiving entity (e.g., another UE 120 and/or another network node 110) may be encoded based at least in part on an error correcting code (sometimes referred to as an error correcting scheme), so that the receiving entity can determine whether the communication was properly transmitted (e.g., so that the receiving entity can verify that the communication was not corrupted by noise or the like) and/or so that the receiving entity can correct any transmission errors using redundant bits provided by the error correcting code, or the like. One example of an error correcting code is an LDPC code. A communication may be encoded based at least in part on an LDPC code to provide for error detection at the receiving entity. Encoding for an LDPC may be performed based at least in part on a base graph (e.g., a sparse bipartite graph). The base graph may identify a code word to be generated from an input data set and/or may identify information to be appended to an input data set to form the LDPC.

More particularly, as shown in FIG. 4, a transmitter 405 may be in wireless communication with a receiver 410. In some cases, the transmitter 405 may one of a UE 120 or a network node 110, and the receiver 410 may be the other one of the UE 120 and the network node 110. The transmitter 405 and the receiver 410 may be in wireless communication via a wireless network, such as the wireless network 100 described in connection with FIG. 1. When the transmitter 405 transmits data to the receiver 410, it may first encode the data using an error correcting code, such as an LDPC code. More particularly, as shown by reference number 415, the transmitter 405 may process raw data to be transmitted to the receiver 410 by feeding the raw data through an LDPC encoder 420, among other signal processing components. The transmitter 405 may perform other signal processing operations (e.g., interleaving or the like), which are not shown in FIG. 4 for ease of the description. The LDPC encoder 420 may add error correction bits to the raw data based at least in part on a selected base graph and/or based at least in part on a target code rate, forming a stream of encoded data, as shown by reference number 425. In some aspects, "code rate" may refer to a number of raw data bits divided by a total number of bits in an encoded data stream (e.g., the code rate is the proportion of the data stream that is useful, or non-redundant), and thus LDPC coding or similar processes associated with a lower code rate provide more error protection, but require additional overhead, than LDPC coding or similar processes associated with a higher code rate. The encoded data may be transmitted by the transmitter 405 to the receiver 410 using a RAN or the like, where the encoded data is fed through an LDPC decoder 430 (and, in some aspects, other signal processing components such as a deinterleaver, or the like) in order to extract the raw data therefrom, as shown by reference number 435.

Although error correction coding processes, such as LDPC coding, may beneficially protect data streams and result in reduced communication error rates, such processes may be associated with large overhead due to the addition of error correction bits to the raw data stream, and/or require relatively high power consumption at the transmitter 405 and the receiver to encode and decode the raw data. For example, in some instances, decoding a channel with an LDPC decoder at the receiver 410 may constitute the greatest power-consuming operation in the digital chain, in some cases representing greater than 60% of the power consumption used by a modem associated with the receiver 410. Error correction coding processes, such as LDPC coding, may consume even more power when implemented for high-frequency communications, such as communications in the millimeter wave (e.g., FR2) bands and/or communications in sub-terahertz bands, such as FR4 and beyond. Such high-frequency communications may be associated with relatively large bandwidths and high data/bit rates, leading to high power consumption associated with LDPC decoding processes or the like. For example, for certain sub-terahertz communications, LDPC power consumption may approach 90% of the overall power consumption by the modem associated with the receiver 410. Thus, a transmitter 405 and a receiver 410 may either forgo LDPC coding and similar error correction coding in order to reduce power consumption, leading to increased transmission error rates and thus unreliable communications, or else employ LDPC coding or a similar error correction coding scheme at a cost of high power consumption and large overhead.

Some techniques and apparatuses described herein enable robust error correction coding processes for uplink transmissions, such as uplink transmissions in the sub-terahertz bands, while providing reduced power consumption at a receiver (e.g., at a network node 110) as compared to the LDPC decoding processes described above. In some aspects, a UE 120 may utilize multi-level coding (MLC) for uplink transmissions, such that one level may be encoded using a first error correction coding scheme (e.g., LDPC coding) while another level may be left uncoded or else encoded using a second error correction coding scheme that consumes less power than LDPC coding or the like. In some aspects, a UE 120 may signal to a network node 110 an indication of whether the UE 120 is capable of using MLC for uplink transmissions, and the network node 110 may configure the UE 120 with a selected MLC scheme based at least in part on the UE 120's capability. As a result, UEs 120 and network nodes 110 may communicate with reduced overhead, reduced error rates, and reduced power consumption, resulting in more reliable wireless communications and overall more efficient usage of power and network resources.

As indicated above, FIG. 4 is provided as an example. Other examples may differ from what is described with regard to FIG. 4.

Figure 5A:
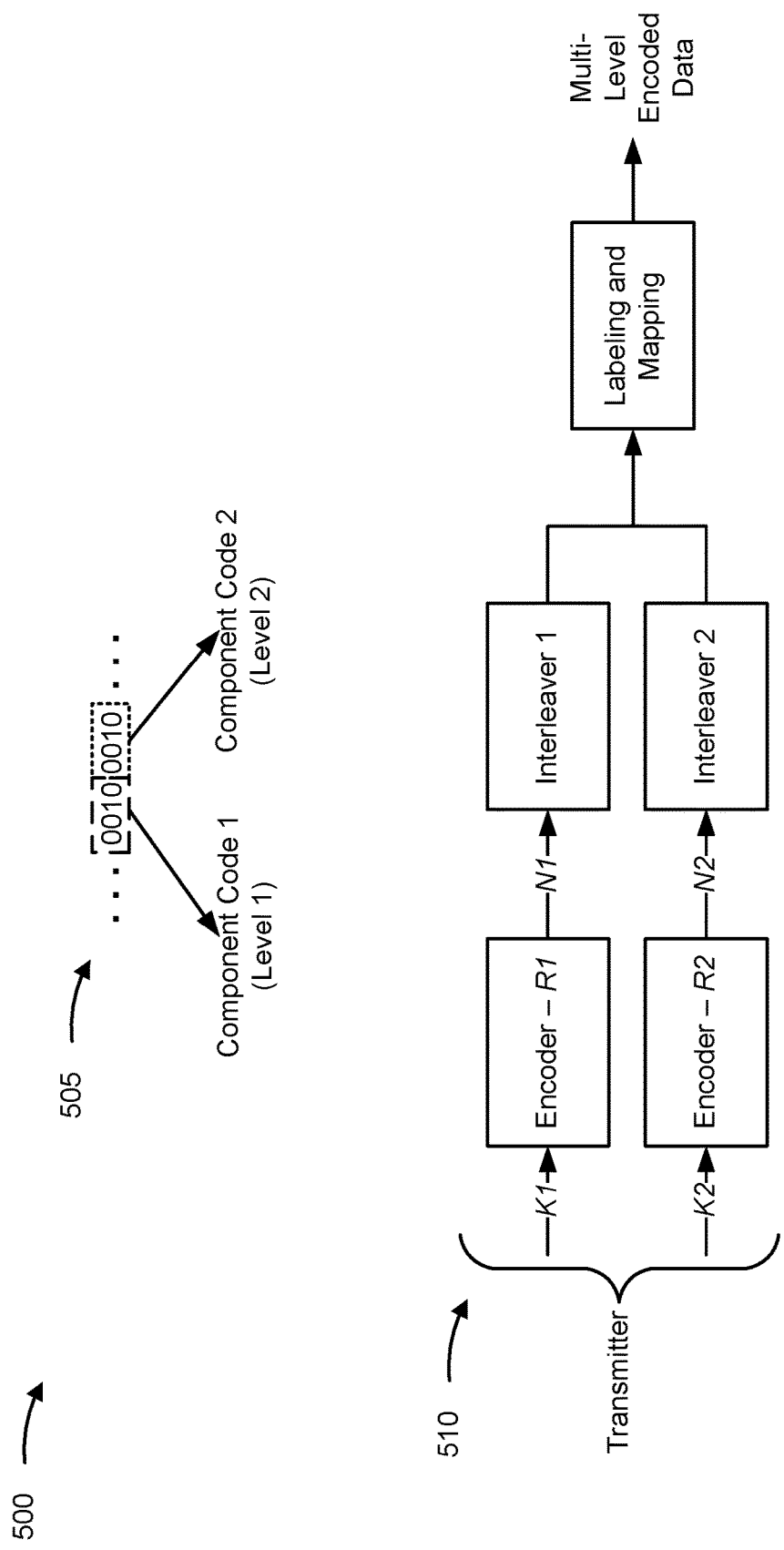
FIGS. 5A-5C are diagrams illustrating an example of a multi-level coding (MLC) procedure, in accordance with the present disclosure.
Figure 5B:
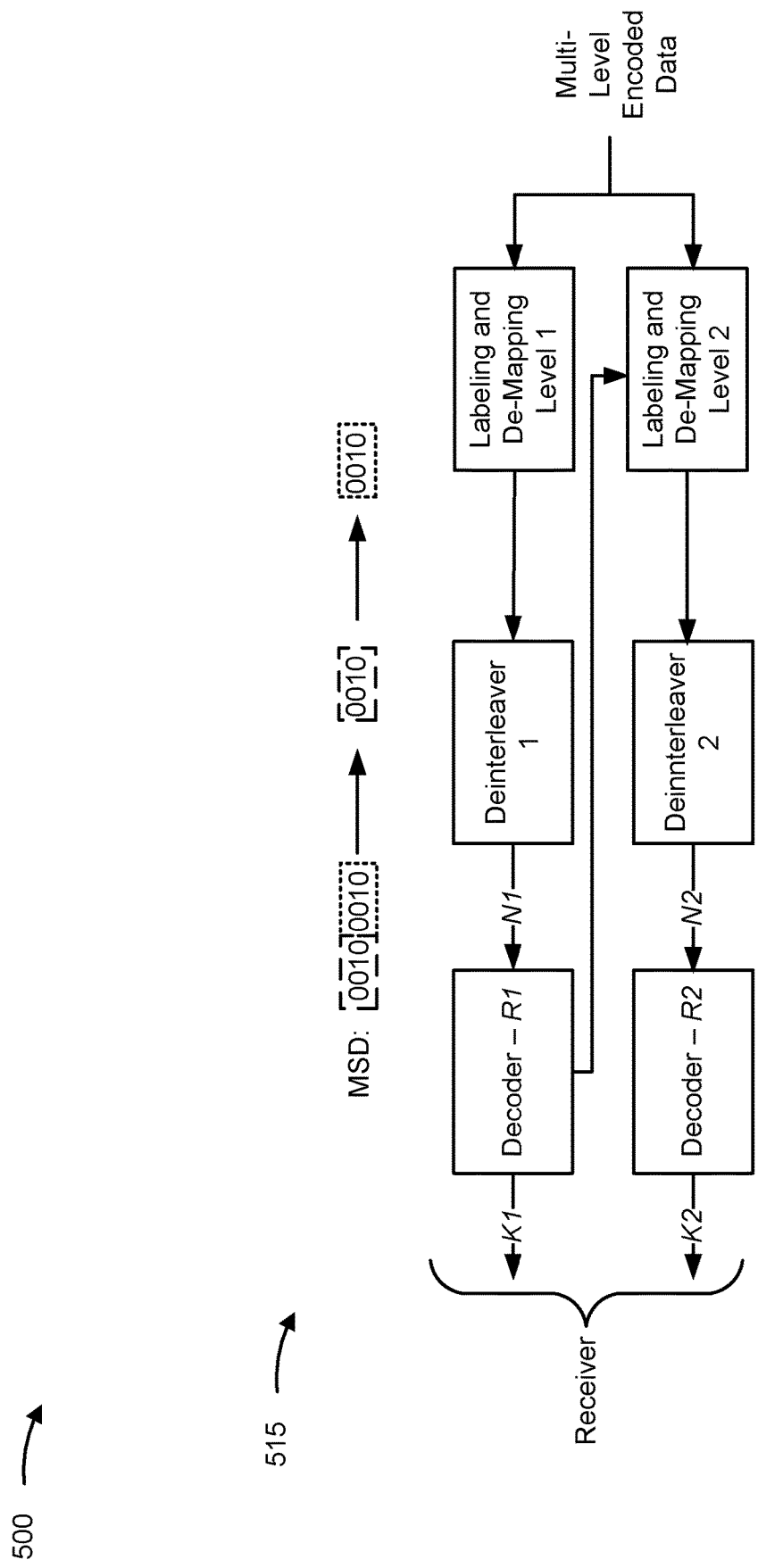
Figure 5C:
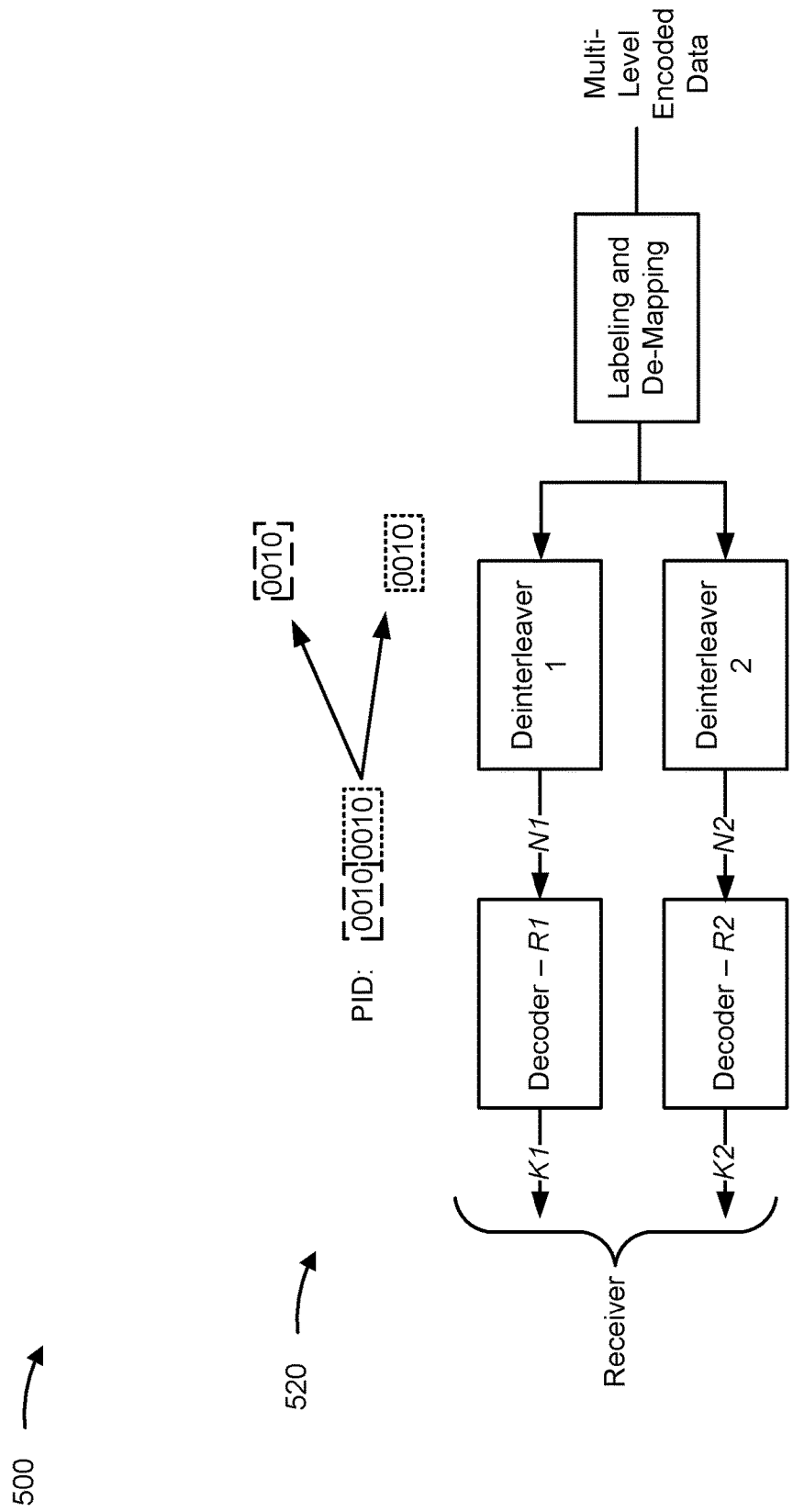

FIGS. 5A-5C are diagrams illustrating an example 500 of an MLC procedure, in accordance with the present disclosure.

MLC, which is sometimes referred to as un-equal error protection, refers to the process of assigning different component codes for non-overlapping subsets of bits in a data stream. In some aspects, each subset of bits may be referred to as a level. For example, with reference to FIG. 5A, and as shown by reference number 505, a data stream is associated with two component codes (e.g., the data stream is associated with two levels). A first subset of bits, which is the first four bits shown, is associated with the first component code (indicated as "Component Code 1") and the first level (indicated as "Level 1"). A second subset of bits, which is the second four bits shown, is associated with the second component code (indicated as "Component Code 2") and the second level (indicated as "Level 2"). In some aspects, each level is protected using a different error correction code. For example, the first level may be protected using an LDPC coding scheme, while the second level may be left uncoded or else may be protected using a simpler error correction code process, such as a Reed-Solomon scheme or the like.

Reference number 510 shows a process for encoding data using MLC. The process shown at reference number 510 may be performed by a transmitter (e.g., a UE 120, a network node 110, a transmitter 405, or the like). Moreover, the process shown by reference number 510 is for two-level MLC, but aspects of the disclosure are not so limited. In some other aspects, more levels (e.g., three or more levels) may be employed without departing from the scope of the invention. Shown as K1 and K2, two component data streams are provided to respective encoders, shown as "Encoder—R1" and "Encoder—R2," resulting in encoded data streams N1 and N2, respectively. In some aspects, one or more of the encoded data streams N1 and N2 may undergo additional signal processing prior to transmission. For example, in the depicted example, both encoded data streams undergo an interleaving process by feeding the encoded data streams N1 and N2 to "Interleaver 1" and "Interleaver 2," respectively. Other signal processing techniques may be performed without departing from the scope of the disclosure. Following the interleaving processes, the data streams are combined and fed to a labeling and mapping component, resulting in a multi-level encoded data stream, such as the encoded data stream described above in connection with reference number 505. The multi-level encoded data stream may then be transmitted to a receiver via a RAN, or the like.

Turning now to FIG. 5B, reference number 515 shows a process for decoding MLC data, such as the multi-level encoded data stream described in connection with reference number 510. The process shown by reference number 515 may be performed by a receiver (e.g., a UE 120, a network node 110, a receiver 410, or the like). Moreover, the process shown by reference number 515 may be referred to as a multi-stage decoding (MSD) process. MSD may include decoding of at least one of the MLC levels based at least in part on knowledge obtained from decoding a previous MLC level (sometimes referred to as partitioning information). For example, in a two-level MLC scheme, such as the two-level MLC scheme described in connection with reference numbers 505 and 510, level 2 may be decoded after level 1 and based at least in part on partitioning information obtained from decoding level 1. However, aspects of the disclosure are not limited to MSD. In some other aspects, the multi-level encoded data may be decoded according to another decoding process, such as a parallel independent decoding (PID) process, which is described in more detail below in connection with FIG. 5C.

In some aspects, the multi-level encoded data stream may be fed to a labeling and de-mapping component associated with each coding level (e.g., in the two-level example shown in FIG. 5B, a "Labeling and De-Mapping Level 1" component and a "Labeling and De-Mapping Level 2" component). The Labeling and De-Mapping Level 1 component may separate the encoded and interleaved stream associated with level 1, and feed the stream to a "Deinterleaver 1" for performing a deinterleaving process to arrive at the first encoded data stream, N1. The first encoded data stream, N1, may then be provided to a decoder (which is shown as "Decoder—R1," which, in some aspects, may correspond to the LDPC decoder 430 described in connection with FIG. 4) to arrive at the first component data stream, K1.

As shown by the arrow connecting the Decoder—R1 to the Labeling and De-Mapping Level 2 component, in this example the output of the level 1 decoder (e.g., the first component data stream, K1) may be used as part of the decoding process for the second component data stream, K2. More particularly, based at least in part on the first component data stream K1, and the multi-level encoded data stream, the Labeling and De-Mapping Level 2 component may separate the encoded and interleaved stream associated with level 2, and feed the stream to a "Deinterleaver 2" for performing a deinterleaving process to arrive at the second encoded data stream, N2. The second encoded data stream N2 may then be provided to a decoder (which is shown as "Decoder—R2," which, in some aspects, may correspond to the LDPC decoder 430 described in connection with FIG. 4) to arrive at the second component data stream K2.

As shown in FIG. 5C, and as indicated by reference number 520, in a PID process, the two component data streams K1 and K2 may be decoded in parallel and/or without knowledge obtained from a previous level decoding. In such aspects, the labeling and de-mapping components described in connection with reference number 515 may be a single component, as shown, that separates two interleaved and encoded data streams from the multi-level encoded data stream. The two interleaved and encoded data streams may then be fed in parallel through the deinterleavers (e.g., Deinterleaver 1 and Deinterleaver 2) and decoders (e.g., Decoder—R1 and Decoder—R2), in a similar manner as described above in connection with FIG. 5B. In some aspects, employing one of the MLC schemes described in connection with FIGS. 5A-5C or a similar MLC scheme may result in reduced overhead and power consumption, as described in connection with FIG. 4. This may be more readily understood with reference to FIGS. 6 and 7, described below.

As indicated above, FIGS. 5A-5C are provided as an example. Other examples may differ from what is described with regard to FIGS. 5A-5C.

Figure 6:
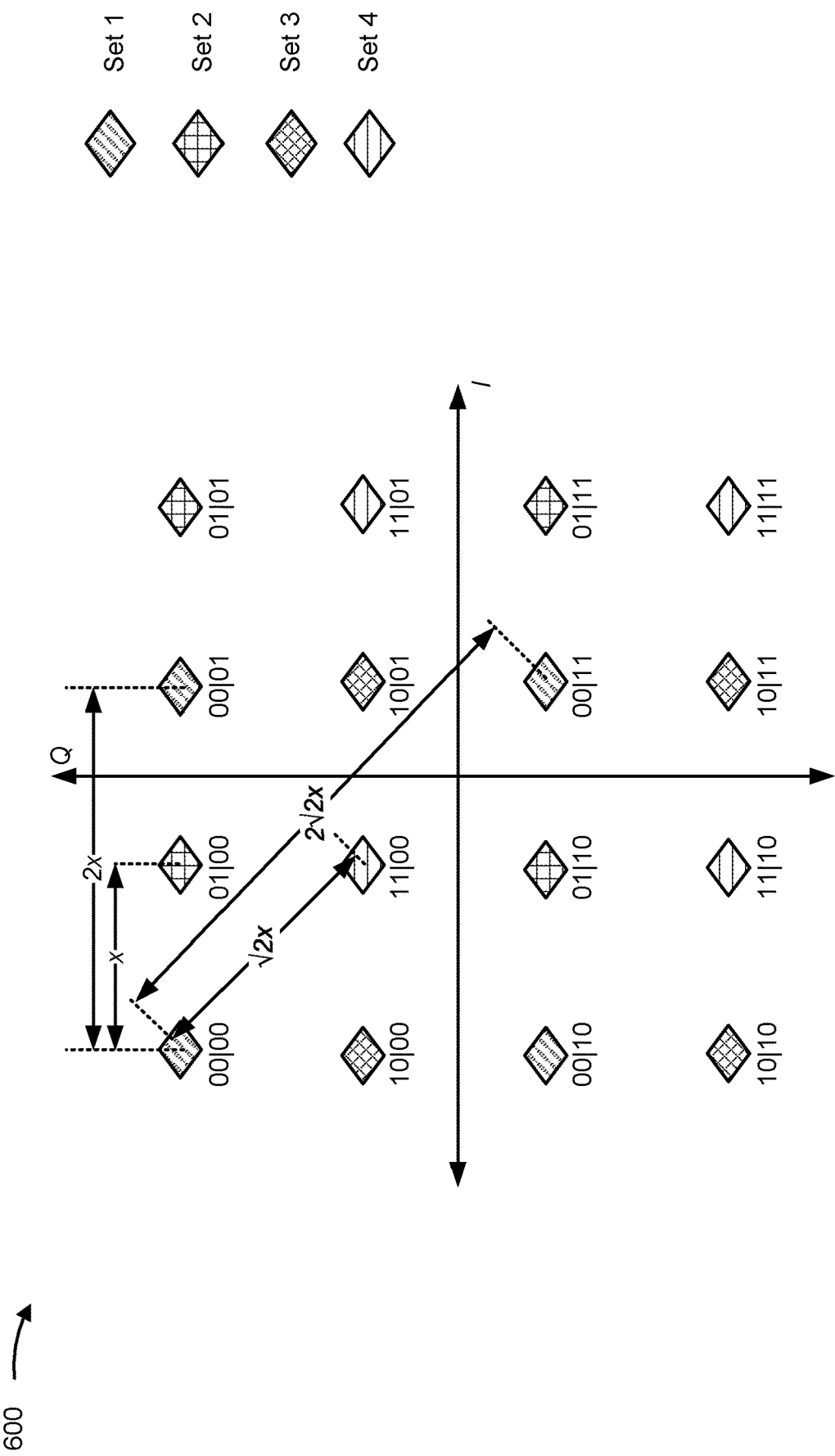
FIG. 6 is a diagram illustrating an example of an MLC constellation diagram, in accordance with the present disclosure.

FIG. 6 is a diagram illustrating an example 600 of an MLC constellation diagram, in accordance with the present disclosure.

The example shown in FIG. 6 is associated with two-level MLC and a 16 quadrature amplitude modulation (16-QAM) MCS. However, aspects of the disclosure are not so limited, and, in some other aspects, a different number of levels may be utilized and/or a different MCS may be implemented without departing from the scope of the disclosure. Moreover, each constellation point in the constellation diagram is associated with a four-bit string. However, in some other aspects, each constellation point may be associated with more or fewer bits without departing from the scope of the disclosure. For example, in examples implementing 32-QAM, 64-QAM, 128-QAM, or 256-QAM, each constellation point may be associated with five bits, six bits, seven bits, or eight bits, respectively. Moreover, in the depicted example each MLC level is associated with two bits per constellation point, but, in some other aspects, each MLC level may be associated with more or fewer bits per constellation point.

As shown, each constellation point may be associated with one of four sets of bit strings, shown as set 1, set 2, set 3, and set 4 in FIG. 6. Each bit string within a set of constellation points may be related by including the same level one bits (e.g., the same first two bits). More particularly, the constellation points associated with 0000, 0001, 0010, and 0011 all belong to set 1 (e.g., set 1 corresponds to level 1 of "00"), the constellation points associated with 0100, 0101, 0110, and 0111 all belong to set 2 (e.g., set 2 corresponds to level 1 of "01"), the constellation points associated with 1000, 1001, 1010, and 1011 all belong to set 3 (e.g., set 3 corresponds to level 1 of "10"), and the constellation points associated with 1100, 1101, 1110, and 1111 all belong to set 4 (e.g., set 4 corresponds to level 1 of "11").

Each constellation point is separated from adjacent constellation points by either a distance x or $\sqrt{2x}$, but is separated from a nearest constellation point belonging to the same set by a distance 2x or $\sqrt{2x}$, as shown. This may advantageously permit un-equal error correction coding for the various MLC layers. For example, the first two bits (e.g., level 1) may be protected using LDPC coding or the like, in order to reduce or eliminate errors associated with determining which set the bits belong to. Thus, a receiver may decode level 1, determining that the first two bits are either 00, 01, 10, or 11, thereby determining a corresponding set for a bit string. That is, once the receiver decodes the first MLC level, the receiver knows that the associated constellation point must be one of the four constellation points within a corresponding set. More particularly, if the first-level bits are 00, then the constellation point must be one of the four constellation points within set 1 (e.g., 0000, 0001, 0010, or 0011). Similarly, if the first-level bits are 01, then the constellation point must be one of the four constellation points within set 2 (e.g., 0100, 0101, 0110, or 0111), if the first-level bits are 10, then the constellation point must be one of the four constellation points within set 3 (e.g., 1000, 1001, 1010, or 1011), and if the first-level bits are 11, then the constellation point must be one of the four constellation points within set 4 (e.g., 1100, 1101, 1110, or 1111). As described, the four constellation points within each set are relatively far from each other (e.g., each constellation point is separated from adjacent constellation points belonging to the same set by a distance 2x or $\sqrt{2x}$), and thus there is less chance of the receiver making an error when decoding the second level bits. Put another way, it is less likely that noise or the like within a signal would cause the receiver to choose the incorrect constellation point when decoding the second level, because the constellation points within a set are separated by relatively large distances. Thus, the second level bits may be protected by a less complex error correction scheme than LDPC coding, such as Reed-Solomon coding or the like, or else the second level may even be left uncoded. As a result, power consumption at the receiver may be reduced because not all of the bits need to be processed by the LDPC decoder.

In some aspects, a UE 120 may implement MLC for uplink transmissions, thereby reducing the power consumption at the network node 110 receiving and decoding the communications. For example, a UE 120 may code at least some of the MLC levels with a simple coding scheme (e.g., Reed-Solomon coding or the like) or else leave at least some of the MLC levels uncoded in order to reduce power consumption at the network node 110 associated with LDPC coding. Aspects of implementing MLC for uplink transmissions are described in more detail in connection with FIG. 7.

As indicated above, FIG. 6 is provided as an example. Other examples may differ from what is described with regard to FIG. 6.

Figure 7:
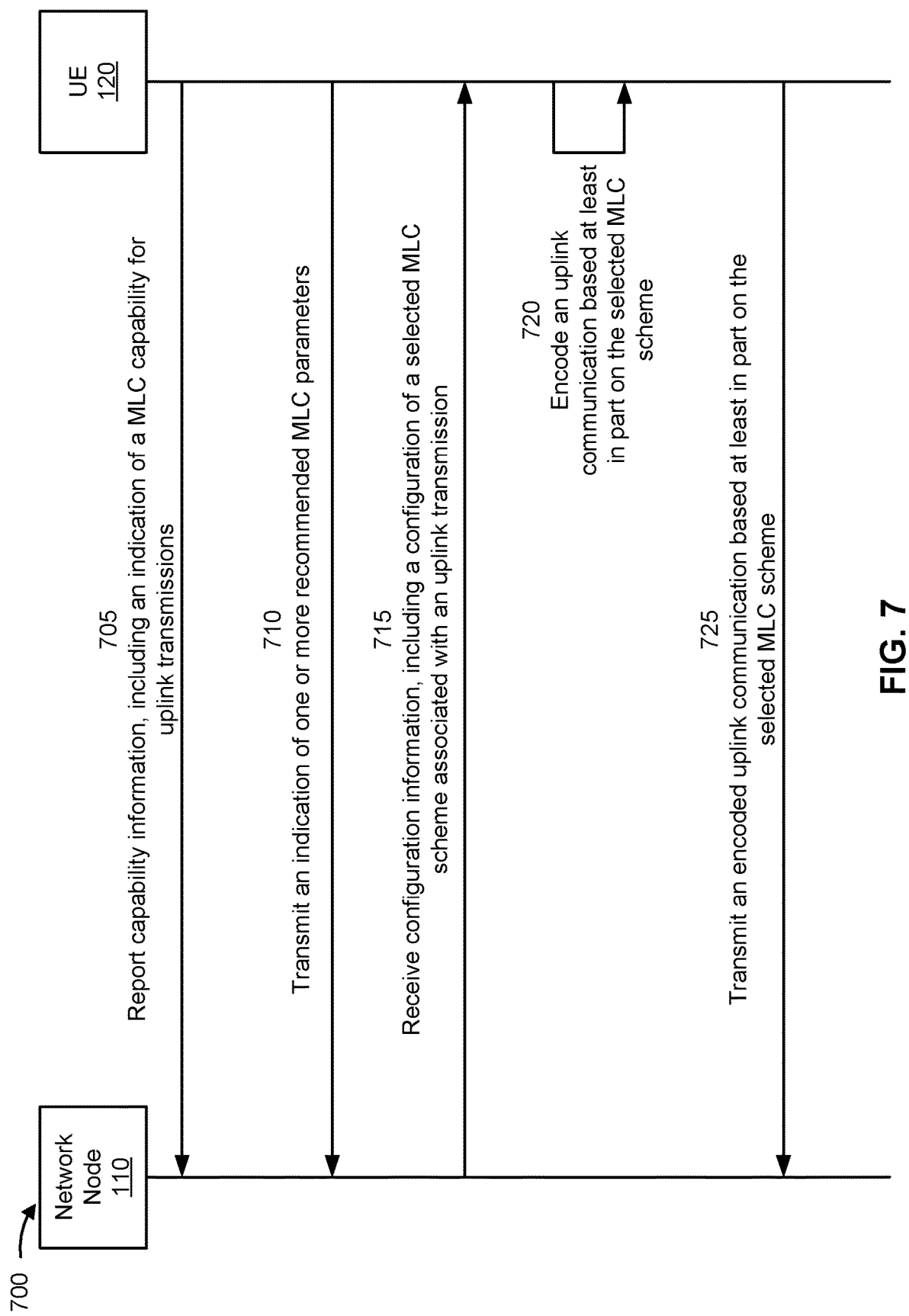
FIG. 7 is a diagram of an example associated with using MLC for uplink transmissions, in accordance with the present disclosure.

FIG. 7 is a diagram of an example 700 associated with using MLC for uplink transmissions, in accordance with the present disclosure. As shown in FIG. 7, a network node 110 may communicate with a UE 120. In some aspects, the network node 110 and the UE 120 may be part of a wireless network (e.g., wireless network 100). The UE 120 and the network node 110 may have established a wireless connection prior to operations shown in FIG. 7.

As shown by reference number 705, the UE 120 may transmit, to the network node 110, a capabilities report. In some aspects, the capabilities report may indicate UE 120 support for MLC for uplink transmissions. More particularly, the UE 120 may transmit, to the network node 110, an indication of a MLC capability for uplink transmissions. In some aspects, the indication of the MLC capability for the uplink transmissions indicates one or more MLC schemes supported by the UE 120. For example, the UE 120 may indicate that the UE 120 supports at least one of an MSD MLC scheme or a PID MLC scheme, as described above in connection with FIGS. 5B and 5C. Additionally, or alternatively, the indication of the MLC capability for the uplink transmissions may indicate a number of supported MLC levels, or similar supported parameters. For example, the UE 120 may indicate that the UE 120 supports two MLC levels or else supports three or more MLC levels.

As shown by reference number 710, the UE 120 may also transmit, to the network node 110, an indication of one or more recommended MLC parameters associated with an MLC scheme to be used for uplink transmissions. In some aspects, the indication of the one or more recommended MLC parameters associated with the MLC scheme to be used for uplink transmissions may be transmitted as part of the capabilities report described in connection with reference number 705, while in some other aspects, the indication of the one or more recommended MLC parameters associated with the MLC scheme to be used for uplink transmissions may be transmitted in a separate message than the capabilities report described in connection with reference number 705. For example, in some aspects, the indication of the one or more recommended MLC parameters associated with the MLC scheme to be used for uplink transmissions may be associated with a channel state information (CSI) report transmitted to the network node 110, or a similar message.

In some aspects, the indication of the one or more recommended MLC parameters associated with the MLC scheme to be used for uplink transmissions may indicate a recommended number of bits associated with each MLC level. For example, as described in connection with FIG. 6, in aspects employing 16-QAM, the UE 120 may recommend that two bits should be associated with each of two MLC levels. In some other aspects, the UE 120 may recommend that more or fewer bits should be associated with each level and/or that more than two levels should be utilized. Additionally, or alternatively, the indication of the one or more recommended MLC parameters associated with the MLC scheme to be used for uplink transmissions may indicate a recommended code rate associated with each MLC level of the multiple MLC levels. Additionally, or alternatively, the indication of the one or more recommended MLC parameters associated with the MLC scheme to be used for uplink transmissions may indicate a recommended modulation type associated with each MLC level of the multiple MLC levels. Additionally, or alternatively, the indication of the one or more recommended MLC parameters associated with the MLC scheme to be used for uplink transmissions may indicate a recommended MLC scheme. For example, the UE 120 may recommend that LDPC coding be used for the first MLC level, and Reed-Solomon coding be used for the second level, or else that the second level should be left uncoded, and/or the UE 120 may recommend that the MSD should be used or that PID should be used.

In some aspects, one more recommended MLC parameters may be based at least in part on measurements of a communication channel or the like performed by the UE 120. For example, in some aspects, the one or more recommended MLC parameters may be based at least in part on a measurement associated with a CSI reference signal (CSI-RS) associated with a channel. Additionally, or alternatively, the one or more recommended MLC parameters may be based at least in part on a computation of decoding probabilities associated with the channel. Additionally, or alternatively, the one or more recommended MLC parameters may be based at least in part on a signal-to-noise ratio (SNR) associated with the channel. Additionally, or alternatively, the one or more recommended MLC parameters may be based at least in part on a delay spread associated with the channel. Additionally, or alternatively, the one or more recommended MLC parameters may be based at least in part on a Doppler shift associated with the channel. Additionally, or alternatively, the one or more recommended MLC parameters may be based at least in part on information associated with impairments at a network device, such as impairments at the UE 120 due to hand blockages, line of sight blockages, or the like.

As shown by reference number 715, the UE 120 may receive, from the network node 110, configuration information. In some aspects, the UE 120 may receive the configuration information via one or more of RRC signaling, one or more medium access control (MAC) control elements (MAC-CEs), and/or downlink control information (DCI), among other examples. In some aspects, the configuration information may include an indication of one or more configuration parameters (e.g., already known to the UE 120 and/or previously indicated by the network node 110 or other network device) for selection by the UE 120, and/or explicit configuration information for the UE 120 to use to configure the UE 120, among other examples.

In some aspects, the configuration information may include a configuration of a selected MLC scheme associated with an uplink transmission, with the configuration of the selected MLC scheme being based at least in part on the indication of the MLC capability for the uplink transmissions described in connection with reference number 705. For example, the selected MLC scheme may be associated with an MSD MLC scheme, a PID MLC scheme, a QAM MCS (such as the 16-QAM scheme described in connection with FIG. 6 or another QAM scheme), an amplitude and phase-shift keying (APSK) MCS, or the like. In some aspects, the selected MLC scheme may be associated with multiple MLC levels, as described in connection with FIGS. 5A-6. In such aspects, the configuration of the selected MLC scheme may indicate a number of bits associated with each MLC level of the multiple MLC levels. Additionally, or alternatively, the configuration of the selected MLC scheme may indicate a code rate associated with each MLC level of the multiple MLC levels.

Moreover, in some aspects, the selected MLC scheme may be associated with un-equal error correction coding, as described in connection with FIG. 6. That is, the selected MLC scheme may be associated with multiple MLC levels, and an error protection scheme associated with a first MLC level of the multiple MLC levels may be different than an error protection scheme associated with a second MLC level of the multiple MLC levels. For example, the first MLC level may be associated with LDPC coding, and the second MLC level may be uncoded or associated with Reed-Solomon coding. In such aspects, the configuration information may indicate the corresponding error protection scheme associated with one or more of the MLC levels.

The UE 120 may configure itself based at least in part on the configuration information. Moreover, in some aspects, the UE 120 may be configured to perform one or more operations described herein based at least in part on the configuration information. For example, as shown by reference number 720, in some aspects, the UE 120 may encode an uplink communication based at least in part on the selected MLC scheme (e.g., based at least in part on the MLC information indicated by the configuration information). As described in connection with FIG. 5A, this may include encoding a first MLC level using a first error correction coding scheme (e.g., LDPC coding or the like) and encoding a second MLC level using a second error correction coding scheme different from the first error correction coding scheme (e.g., Reed-Solomon coding or else leaving the second level uncoded).

As shown by reference number 725, the UE 120 may communicate with the network node 110 based at least in part on the configuration information described in connection with reference number 715. For example, the UE 120 may transmit, to the network node 110, an encoded uplink communication based at least in part on a selected MLC scheme. In some aspects, the UE 120 may communicate with the network node 110 using a high-frequency band. More particularly, in some aspects, the uplink transmission shown by reference number 725 may be associated with a sub-terahertz frequency band.

Based at least in part on UE 120 transmitting uplink communications using an MLC scheme, the UE 120 and/or the network node 110 may conserve computing, power, network, and/or communication resources that may have otherwise been consumed by conventional uplink transmission error correction coding processes, such as LDPC encoding and decoding processes. For example, based at least in part on UE 120 implementing MLC for uplink transmissions, thereby enabling certain levels to be coded with a less complex error correction coding scheme than LDPC coding or else be left uncoded, the UE 120 and the network node 110 may communicate with a reduced overhead and may encode and decode messages using reduced power consumption, as described.

As indicated above, FIG. 7 is provided as an example. Other examples may differ from what is described with respect to FIG. 7.

Figure 8:
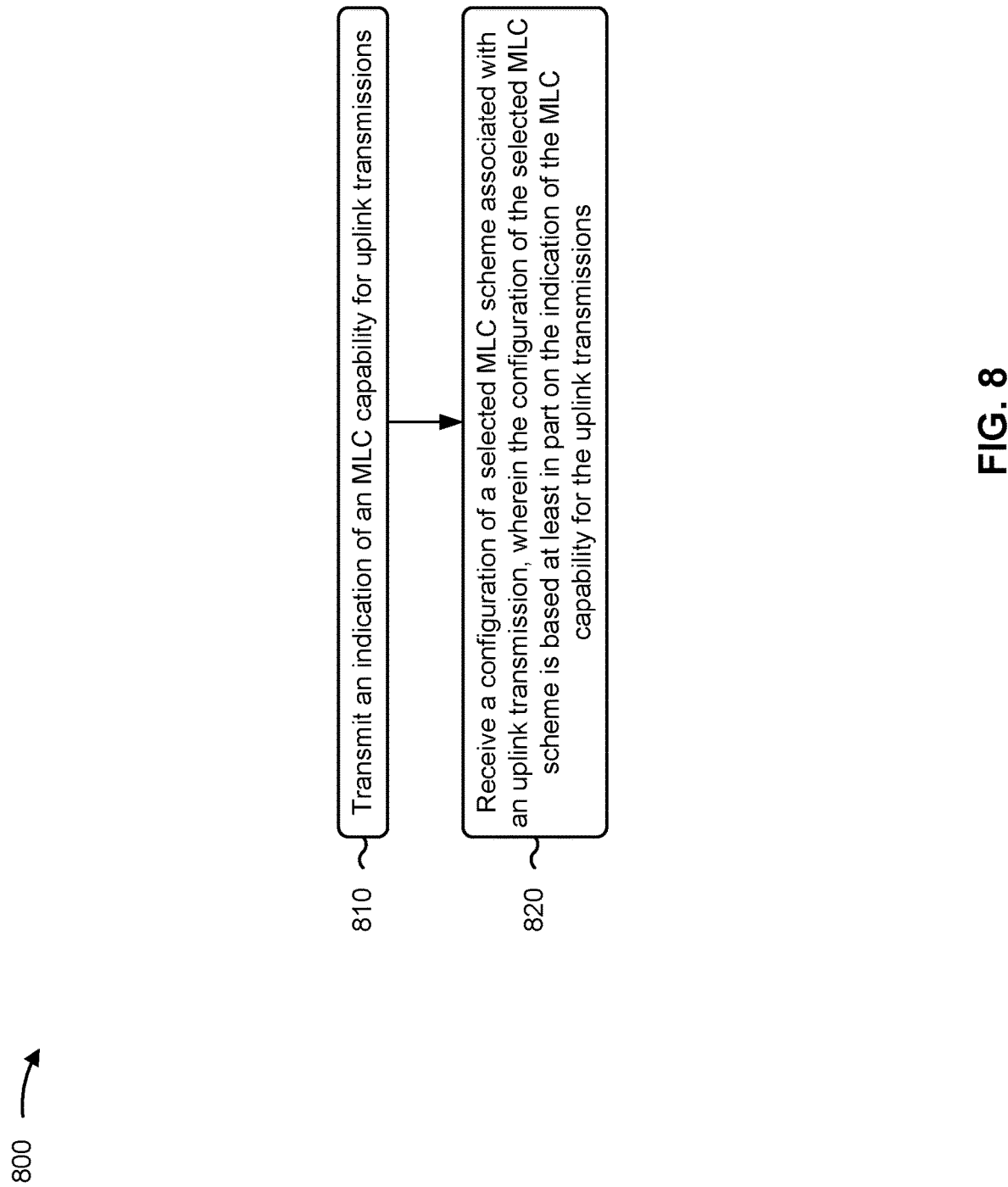
FIG. 8 is a diagram illustrating an example process performed, for example, by a UE, in accordance with the present disclosure.

FIG. 8 is a diagram illustrating an example process 800 performed, for example, by a UE, in accordance with the present disclosure. Example process 800 is an example where the UE (e.g., UE 120) performs operations associated with MLC for uplink transmissions.

As shown in FIG. 8, in some aspects, process 800 may include transmitting an indication of an MLC capability for uplink transmissions (block 810). For example, the UE (e.g., using communication manager 140 and/or transmission component 1004, depicted in FIG. 10) may transmit an indication of an MLC capability for uplink transmissions, as described above.

As further shown in FIG. 8, in some aspects, process 800 may include receiving a configuration of a selected MLC scheme associated with an uplink transmission, wherein the configuration of the selected MLC scheme is based at least in part on the indication of the MLC capability for the uplink transmissions (block 820). For example, the UE (e.g., using communication manager 140 and/or reception component 1002, depicted in FIG. 10) may receive a configuration of a selected MLC scheme associated with an uplink transmission, wherein the configuration of the selected MLC scheme is based at least in part on the indication of the MLC capability for the uplink transmissions, as described above.

Process 800 may include additional aspects, such as any single aspect or any combination of aspects described below and/or in connection with one or more other processes described elsewhere herein.

In a first aspect, the uplink transmission is associated with a sub-terahertz frequency band.

In a second aspect, alone or in combination with the first aspect, the indication of the MLC capability for the uplink transmissions indicates one or more supported MLC schemes.

In a third aspect, alone or in combination with one or more of the first and second aspects, the one or more supported MLC schemes include at least one of a multi-stage decoding MLC scheme or a parallel independent decoding MLC scheme.

In a fourth aspect, alone or in combination with one or more of the first through third aspects, the indication of the MLC capability for the uplink transmissions indicates a number of supported MLC levels.

In a fifth aspect, alone or in combination with one or more of the first through fourth aspects, the selected MLC scheme is associated with multiple MLC levels, and the configuration of the selected MLC scheme indicates at least one of a number of bits associated with each MLC level of the multiple MLC levels, or a code rate associated with each MLC level of the multiple MLC levels.

In a sixth aspect, alone or in combination with one or more of the first through fifth aspects, the selected MLC scheme is associated with multiple MLC levels, and an error protection scheme associated with a first MLC level of the multiple MLC levels is different than an error protection scheme associated with a second MLC level of the multiple MLC levels.

In a seventh aspect, alone or in combination with one or more of the first through sixth aspects, the first MLC level is associated with low density parity check coding, and the second MLC level is uncoded or associated with Reed-Solomon coding.

In an eighth aspect, alone or in combination with one or more of the first through seventh aspects, process 800 includes transmitting an indication of one or more recommended MLC parameters associated with the selected MLC scheme.

In a ninth aspect, alone or in combination with one or more of the first through eighth aspects, the one or more recommended MLC parameters include at least one of a recommended number of bits associated with each MLC level of multiple MLC levels associated with the selected MLC scheme, a recommended code rate associated with each MLC level of the multiple MLC levels, a recommended modulation type associated with each MLC level of the multiple MLC levels, or a recommended MLC scheme.

In a tenth aspect, alone or in combination with one or more of the first through ninth aspects, the one or more recommended MLC parameters are based at least in part on at least one of a measurement associated with a channel state information reference signal associated with a channel, a computation of decoding probabilities associated with the channel, a signal-to-noise ratio associated with the channel, a delay spread associated with the channel, a Doppler shift associated with the channel, or information associated with impairments at the UE.

In an eleventh aspect, alone or in combination with one or more of the first through tenth aspects, the selected MLC scheme is associated with at least one of a multi-stage decoding MLC scheme, a parallel independent decoding MLC scheme, a QAM MCS, or an APSK MCS.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

Figure 9:
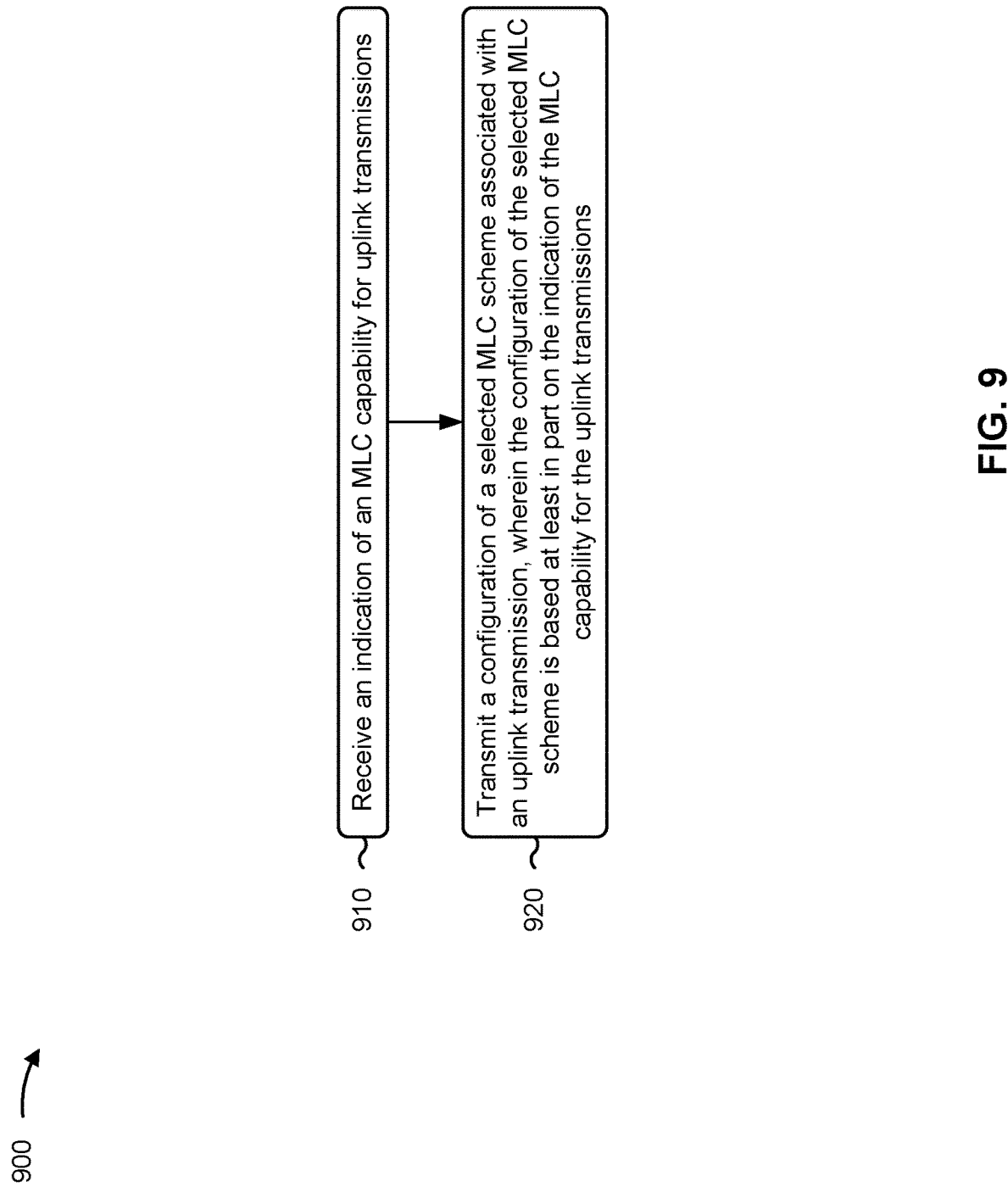
FIG. 9 is a diagram illustrating an example process performed, for example, by a network node, in accordance with the present disclosure.

FIG. 9 is a diagram illustrating an example process 900 performed, for example, by a network node, in accordance with the present disclosure. Example process 900 is an example where the network node (e.g., network node 110) performs operations associated with MLC for uplink transmissions.

As shown in FIG. 9, in some aspects, process 900 may include receiving an indication of an MLC capability for uplink transmissions (block 910). For example, the network node (e.g., using communication manager 150 and/or reception component 1102, depicted in FIG. 11) may receive an indication of an MLC capability for uplink transmissions, as described above.

As further shown in FIG. 9, in some aspects, process 900 may include transmitting a configuration of a selected MLC scheme associated with an uplink transmission, wherein the configuration of the selected MLC scheme is based at least in part on the indication of the MLC capability for the uplink transmissions (block 920). For example, the network node (e.g., using communication manager 150 and/or transmission component 1104, depicted in FIG. 11) may transmit a configuration of a selected MLC scheme associated with an uplink transmission, wherein the configuration of the selected MLC scheme is based at least in part on the indication of the MLC capability for the uplink transmissions, as described above.

Process 900 may include additional aspects, such as any single aspect or any combination of aspects described below and/or in connection with one or more other processes described elsewhere herein.

In a first aspect, the uplink transmission is associated with a sub-terahertz frequency band.

In a second aspect, alone or in combination with the first aspect, the indication of the MLC capability for the uplink transmissions indicates one or more supported MLC schemes.

In a third aspect, alone or in combination with one or more of the first and second aspects, the one or more supported MLC schemes include at least one of a multi-stage decoding MLC scheme or a parallel independent decoding MLC scheme.

In a fourth aspect, alone or in combination with one or more of the first through third aspects, the indication of the MLC capability for the uplink transmissions indicates a number of supported MLC levels.

In a fifth aspect, alone or in combination with one or more of the first through fourth aspects, the selected MLC scheme is associated with multiple MLC levels, and the configuration of the selected MLC scheme indicates at least one of a number of bits associated with each MLC level of the multiple MLC levels, or a code rate associated with each MLC level of the multiple MLC levels.

In a sixth aspect, alone or in combination with one or more of the first through fifth aspects, the selected MLC scheme is associated with multiple MLC levels, and an error protection scheme associated with a first MLC level of the multiple MLC levels is different than an error protection scheme associated with a second MLC level of the multiple MLC levels.

In a seventh aspect, alone or in combination with one or more of the first through sixth aspects, the first MLC level is associated with low density parity check coding, and the second MLC level is uncoded or associated with Reed-Solomon coding.

In an eighth aspect, alone or in combination with one or more of the first through seventh aspects, process 900 includes receiving an indication of one or more recommended MLC parameters associated with the selected MLC scheme.

In a ninth aspect, alone or in combination with one or more of the first through eighth aspects, the one or more recommended MLC parameters include at least one of a recommended number of bits associated with each MLC level of multiple MLC levels associated with the selected MLC scheme, a recommended code rate associated with each MLC level of the multiple MLC levels, a recommended modulation type associated with each MLC level of the multiple MLC levels, or a recommended MLC scheme.

In a tenth aspect, alone or in combination with one or more of the first through ninth aspects, the one or more recommended MLC parameters are based at least in part on at least one of a measurement associated with a channel state information reference signal associated with a channel, a computation of decoding probabilities associated with the channel, a signal-to-noise ratio associated with the channel, a delay spread associated with the channel, a Doppler shift associated with the channel, or information associated with impairments at a network device.

In an eleventh aspect, alone or in combination with one or more of the first through tenth aspects, the selected MLC scheme is associated with at least one of a multi-stage decoding MLC scheme, a parallel independent decoding MLC scheme, a QAM MCS, or an APSK MCS.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

Figure 10:
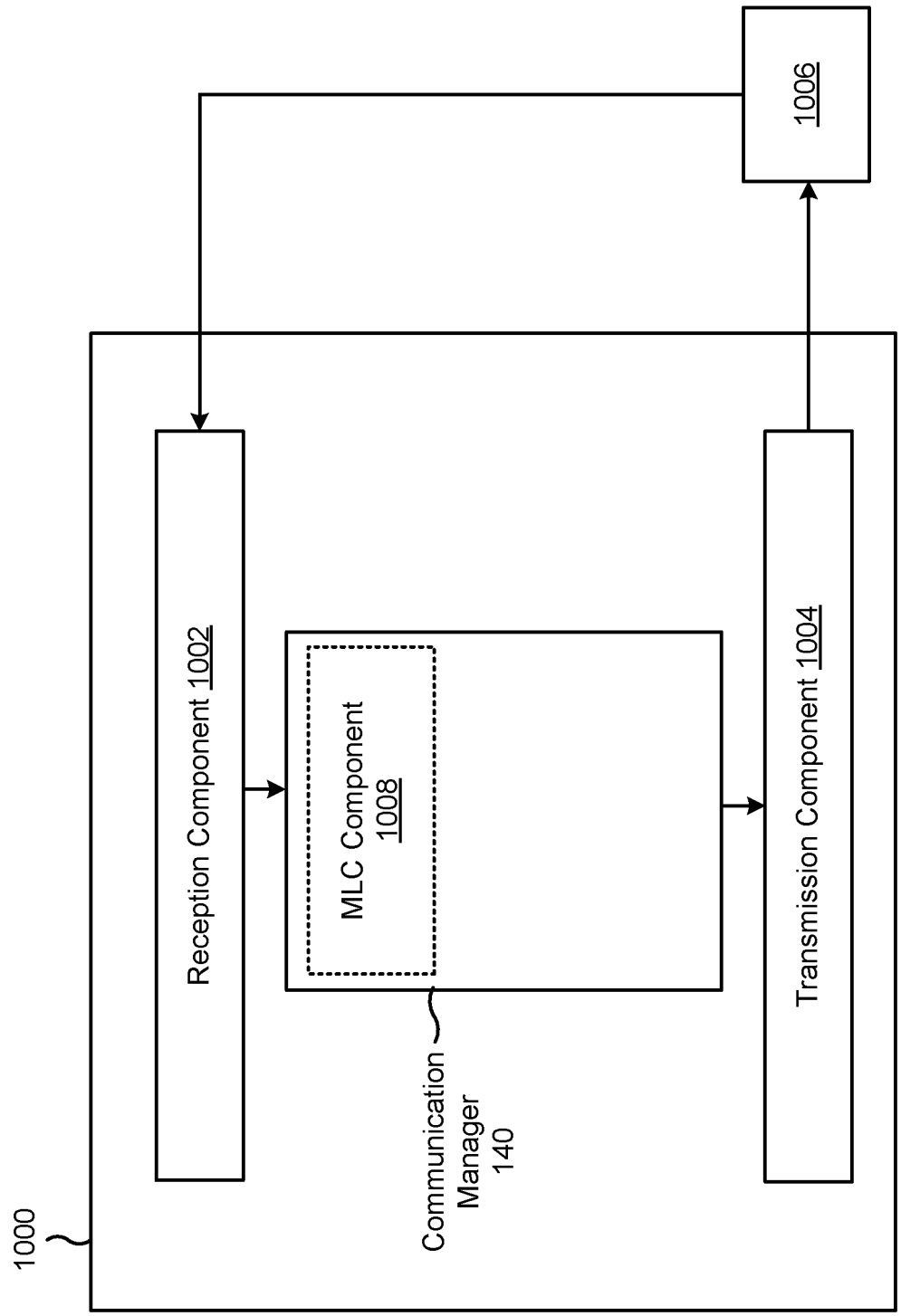
FIG. 10 is a diagram of an example apparatus for wireless communication, in accordance with the present disclosure.

FIG. 10 is a diagram of an example apparatus 1000 for wireless communication, in accordance with the present disclosure. The apparatus 1000 may be a UE (e.g., UE 120), or a UE may include the apparatus 1000. In some aspects, the apparatus 1000 includes a reception component 1002 and a transmission component 1004, which may be in communication with one another (for example, via one or more buses and/or one or more other components). As shown, the apparatus 1000 may communicate with another apparatus 1006 (such as a UE, a network node, or another wireless communication device) using the reception component 1002 and the transmission component 1004. As further shown, the apparatus 1000 may include the communication manager 140. The communication manager 140 may include an MLC component 1008 among other examples.

In some aspects, the apparatus 1000 may be configured to perform one or more operations described herein in connection with FIGS. 5A-7. Additionally, or alternatively, the apparatus 1000 may be configured to perform one or more processes described herein, such as process 800 of FIG. 8. In some aspects, the apparatus 1000 and/or one or more components shown in FIG. 10 may include one or more components of the UE 120 described in connection with FIG. 2. Additionally, or alternatively, one or more components shown in FIG. 10 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1002 may receive communications, such as reference signals, control information, data communications, or a combination thereof, from the apparatus 1006. The reception component 1002 may provide received communications to one or more other components of the apparatus 1000. In some aspects, the reception component 1002 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1000. In some aspects, the reception component 1002 may include one or more antennas, a modem, a demodulator, a MIMO detector, a receive processor, a controller/processor, a memory, or a combination thereof, of the UE 120 described in connection with FIG. 2.

The transmission component 1004 may transmit communications, such as reference signals, control information, data communications, or a combination thereof, to the apparatus 1006. In some aspects, one or more other components of the apparatus 1000 may generate communications and may provide the generated communications to the transmission component 1004 for transmission to the apparatus 1006. In some aspects, the transmission component 1004 may perform signal processing on the generated communications (such as filtering, amplification, modulation, digital-to-analog conversion, multiplexing, interleaving, mapping, or encoding, among other examples), and may transmit the processed signals to the apparatus 1006. In some aspects, the transmission component 1004 may include one or more antennas, a modem, a modulator, a transmit MIMO processor, a transmit processor, a controller/processor, a memory, or a combination thereof, of the UE 120 described in connection with FIG. 2. In some aspects, the transmission component 1004 may be co-located with the reception component 1002 in a transceiver.

The transmission component 1004 and/or the MLC component 1008 may transmit an indication of an MLC capability for uplink transmissions. The reception component 1002 and/or the MLC component 1008 may receive a configuration of a selected MLC scheme associated with an uplink transmission, wherein the configuration of the selected MLC scheme is based at least in part on the indication of the MLC capability for the uplink transmissions.

The transmission component 1004 and/or the MLC component 1008 may transmit an indication of one or more recommended MLC parameters associated with the selected MLC scheme.

The number and arrangement of components shown in FIG. 10 are provided as an example. In practice, there may be additional components, fewer components, different components, or differently arranged components than those shown in FIG. 10. Furthermore, two or more components shown in FIG. 10 may be implemented within a single component, or a single component shown in FIG. 10 may be implemented as multiple, distributed components. Additionally, or alternatively, a set of (one or more) components shown in FIG. 10 may perform one or more functions described as being performed by another set of components shown in FIG. 10.

Figure 11:
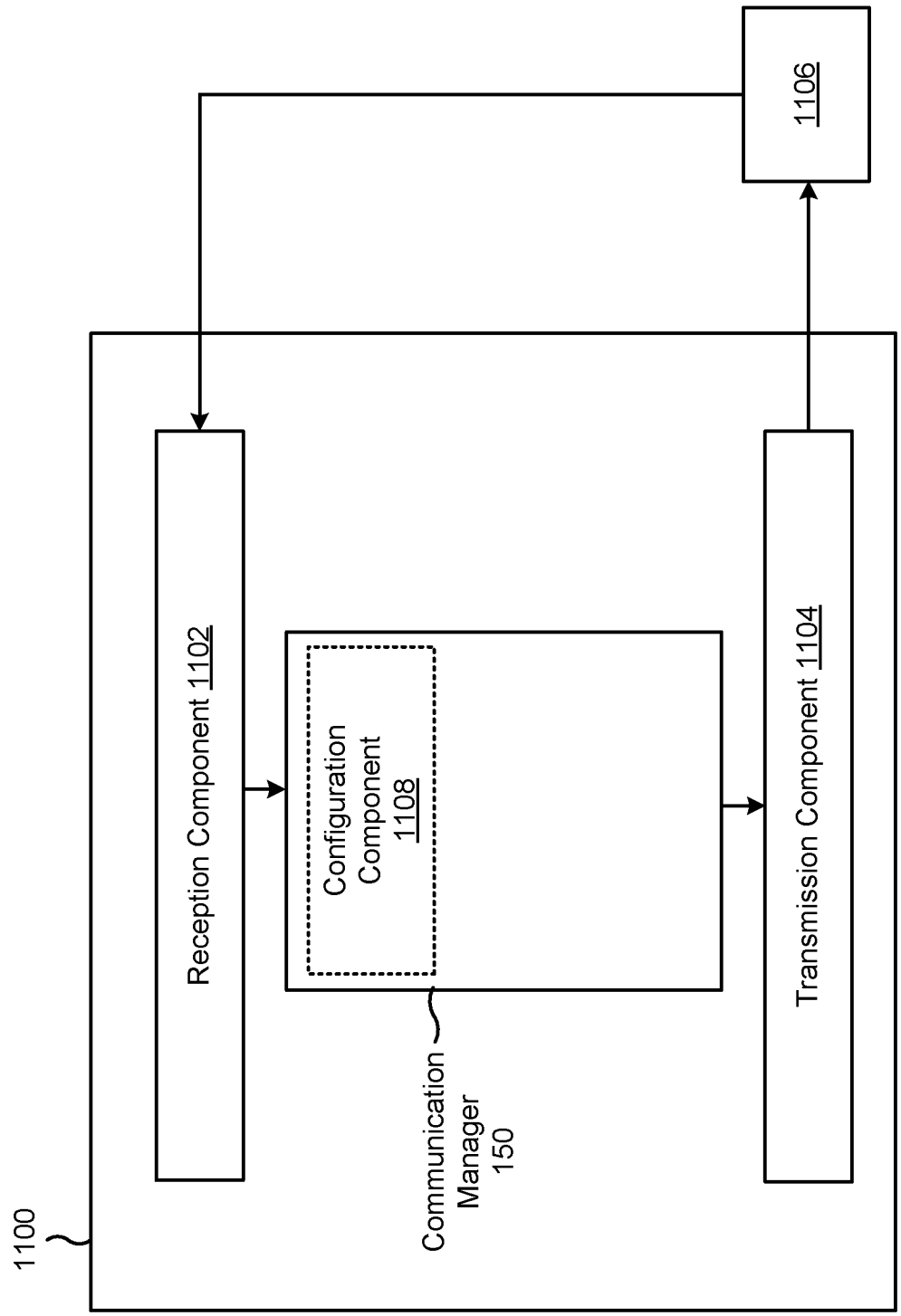
FIG. 11 is a diagram of an example apparatus for wireless communication, in accordance with the present disclosure.

FIG. 11 is a diagram of an example apparatus 1100 for wireless communication, in accordance with the present disclosure. The apparatus 1100 may be a network node (e.g., network node 110), or a network node may include the apparatus 1100. In some aspects, the apparatus 1100 includes a reception component 1102 and a transmission component 1104, which may be in communication with one another (for example, via one or more buses and/or one or more other components). As shown, the apparatus 1100 may communicate with another apparatus 1106 (such as a UE, a network node, or another wireless communication device) using the reception component 1102 and the transmission component 1104. As further shown, the apparatus 1100 may include the communication manager 150. The communication manager 150 may include a configuration component 1108, among other examples.

In some aspects, the apparatus 1100 may be configured to perform one or more operations described herein in connection with FIGS. 5A-7. Additionally, or alternatively, the apparatus 1100 may be configured to perform one or more processes described herein, such as process 900 of FIG. 9. In some aspects, the apparatus 1100 and/or one or more components shown in FIG. 11 may include one or more components of the network node 110 described in connection with FIG. 2. Additionally, or alternatively, one or more components shown in FIG. 11 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1102 may receive communications, such as reference signals, control information, data communications, or a combination thereof, from the apparatus 1106. The reception component 1102 may provide received communications to one or more other components of the apparatus 1100. In some aspects, the reception component 1102 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1100. In some aspects, the reception component 1102 may include one or more antennas, a modem, a demodulator, a MIMO detector, a receive processor, a controller/processor, a memory, or a combination thereof, of the network node 110 described in connection with FIG. 2.

The transmission component 1104 may transmit communications, such as reference signals, control information, data communications, or a combination thereof, to the apparatus 1106. In some aspects, one or more other components of the apparatus 1100 may generate communications and may provide the generated communications to the transmission component 1104 for transmission to the apparatus 1106. In some aspects, the transmission component 1104 may perform signal processing on the generated communications (such as filtering, amplification, modulation, digital-to-analog conversion, multiplexing, interleaving, mapping, or encoding, among other examples), and may transmit the processed signals to the apparatus 1106. In some aspects, the transmission component 1104 may include one or more antennas, a modem, a modulator, a transmit MIMO processor, a transmit processor, a controller/processor, a memory, or a combination thereof, of the network node 110 described in connection with FIG. 2. In some aspects, the transmission component 1104 may be co-located with the reception component 1102 in a transceiver.

The reception component 1102 may receive an indication of an MLC capability for uplink transmissions. The transmission component 1104 and/or the configuration component 1108 may transmit a configuration of a selected MLC scheme associated with an uplink transmission, wherein the configuration of the selected MLC scheme is based at least in part on the indication of the MLC capability for the uplink transmissions.

The reception component 1102 may receive an indication of one or more recommended MLC parameters associated with the selected MLC scheme.

The number and arrangement of components shown in FIG. 11 are provided as an example. In practice, there may be additional components, fewer components, different components, or differently arranged components than those shown in FIG. 11. Furthermore, two or more components shown in FIG. 11 may be implemented within a single component, or a single component shown in FIG. 11 may be implemented as multiple, distributed components. Additionally, or alternatively, a set of (one or more) components shown in FIG. 11 may perform one or more functions described as being performed by another set of components shown in FIG. 11.

The following provides an overview of some Aspects of the present disclosure:

Aspect 1: A method of wireless communication performed by a UE, comprising: transmitting an indication of an MLC capability for uplink transmissions; and receiving a configuration of a selected MLC scheme associated with an uplink transmission, wherein the configuration of the selected MLC scheme is based at least in part on the indication of the MLC capability for the uplink transmissions.

Aspect 2: The method of Aspect 1, wherein the uplink transmission is associated with a sub-terahertz frequency band.

Aspect 3: The method of any of Aspects 1-2, wherein the indication of the MLC capability for the uplink transmissions indicates one or more supported MLC schemes.

Aspect 4: The method of Aspect 3, wherein the one or more supported MLC schemes include at least one of a multi-stage decoding MLC scheme or a parallel independent decoding MLC scheme.

Aspect 5: The method of any of Aspects 1-4, wherein the indication of the MLC capability for the uplink transmissions indicates a number of supported MLC levels.

Aspect 6: The method of any of Aspects 1-5, wherein the selected MLC scheme is associated with multiple MLC levels, and wherein the configuration of the selected MLC scheme indicates a number of bits associated with each MLC level of the multiple MLC levels and a code rate associated with each MLC level of the multiple MLC levels.

Aspect 7: The method of any of Aspects 1-6, wherein the selected MLC scheme is associated with multiple MLC levels, and wherein an error protection scheme associated with a first MLC level of the multiple MLC levels is different than an error protection scheme associated with a second MLC level of the multiple MLC levels.

Aspect 8: The method of Aspect 7, wherein the first MLC level is associated with low density parity check coding, and wherein the second MLC level is uncoded or associated with Reed-Solomon coding.

Aspect 9: The method of any of Aspects 1-8, further comprising transmitting an indication of one or more recommended MLC parameters associated with the selected MLC scheme.

Aspect 10: The method of Aspect 9, wherein the one or more recommended MLC parameters include at least one of: a recommended number of bits associated with each MLC level of multiple MLC levels associated with the selected MLC scheme, a recommended code rate associated with each MLC level of the multiple MLC levels, a recommended modulation type associated with each MLC level of the multiple MLC levels, or a recommended MLC scheme.

Aspect 11: The method of any of Aspects 9-10, wherein the one or more recommended MLC parameters are based at least in part on at least one of: a measurement associated with a channel state information reference signal associated with a channel, a computation of decoding probabilities associated with the channel, a signal-to-noise ratio associated with the channel, a delay spread associated with the channel, a Doppler shift associated with the channel, or information associated with impairments at the UE.

Aspect 12: The method of any of Aspects 1-11, wherein the selected MLC scheme is associated with at least one of: a multi-stage decoding MLC scheme, a parallel independent decoding MLC scheme, a QAM MCS, or an APSK MCS.

Aspect 13: A method of wireless communication performed by a network node, comprising: receiving an indication of an MLC capability for uplink transmissions; and transmitting a configuration of a selected MLC scheme associated with an uplink transmission, wherein the configuration of the selected MLC scheme is based at least in part on the indication of the MLC capability for the uplink transmissions.

Aspect 14: The method of Aspect 13, wherein the uplink transmission is associated with a sub-terahertz frequency band.

Aspect 15: The method of any of Aspects 13-14, wherein the indication of the MLC capability for the uplink transmissions indicates one or more supported MLC schemes.

Aspect 16: The method of Aspect 15, wherein the one or more supported MLC schemes include at least one of a multi-stage decoding MLC scheme or a parallel independent decoding MLC scheme.

Aspect 17: The method of any of Aspects 13-16, wherein the indication of the MLC capability for the uplink transmissions indicates a number of supported MLC levels.

Aspect 18: The method of any of Aspects 13-17, wherein the selected MLC scheme is associated with multiple MLC levels, and wherein the configuration of the selected MLC scheme indicates a number of bits associated with each MLC level of the multiple MLC levels and a code rate associated with each MLC level of the multiple MLC levels.

Aspect 19: The method of any of Aspects 13-18, wherein the selected MLC scheme is associated with multiple MLC levels, and wherein an error protection scheme associated with a first MLC level of the multiple MLC levels is different than an error protection scheme associated with a second MLC level of the multiple MLC levels.

Aspect 20: The method of Aspect 19, wherein the first MLC level is associated with low density parity check coding, and wherein the second MLC level is uncoded or associated with Reed-Solomon coding.

Aspect 21: The method of any of Aspects 13-20, further comprising receiving an indication of one or more recommended MLC parameters associated with the selected MLC scheme.

Aspect 22: The method of Aspect 21, wherein the one or more recommended MLC parameters include at least one of: a recommended number of bits associated with each MLC level of multiple MLC levels associated with the selected MLC scheme, a recommended code rate associated with each MLC level of the multiple MLC levels, a recommended modulation type associated with each MLC level of the multiple MLC levels, or a recommended MLC scheme.

Aspect 23: The method of any of Aspects 21-22, wherein the one or more recommended MLC parameters are based at least in part on at least one of: a measurement associated with a channel state information reference signal associated with a channel, a computation of decoding probabilities associated with the channel, a signal-to-noise ratio associated with the channel, a delay spread associated with the channel, a Doppler shift associated with the channel, or information associated with impairments at a network device.

Aspect 24: The method of any of Aspects 13-23, wherein the selected MLC scheme is associated with at least one of: a multi-stage decoding MLC scheme, a parallel independent decoding MLC scheme, a QAM MCS, or an APSK MCS.

Aspect 25: An apparatus for wireless communication at a device, comprising a processor; memory coupled with the processor; and instructions stored in the memory and executable by the processor to cause the apparatus to perform the method of one or more of Aspects 1-12.

Aspect 26: A device for wireless communication, comprising a memory and one or more processors coupled to the memory, the one or more processors configured to perform the method of one or more of Aspects 1-12.

Aspect 27: An apparatus for wireless communication, comprising at least one means for performing the method of one or more of Aspects 1-12.

Aspect 28: A non-transitory computer-readable medium storing code for wireless communication, the code comprising instructions executable by a processor to perform the method of one or more of Aspects 1-12.

Aspect 29: A non-transitory computer-readable medium storing a set of instructions for wireless communication, the set of instructions comprising one or more instructions that, when executed by one or more processors of a device, cause the device to perform the method of one or more of Aspects 1-12.

Aspect 30: An apparatus for wireless communication at a device, comprising a processor; memory coupled with the processor; and instructions stored in the memory and executable by the processor to cause the apparatus to perform the method of one or more of Aspects 13-24.

Aspect 31: A device for wireless communication, comprising a memory and one or more processors coupled to the memory, the one or more processors configured to perform the method of one or more of Aspects 13-24.

Aspect 32: An apparatus for wireless communication, comprising at least one means for performing the method of one or more of Aspects 13-24.

Aspect 33: A non-transitory computer-readable medium storing code for wireless communication, the code comprising instructions executable by a processor to perform the method of one or more of Aspects 13-24.

Aspect 34: A non-transitory computer-readable medium storing a set of instructions for wireless communication, the set of instructions comprising one or more instructions that, when executed by one or more processors of a device, cause the device to perform the method of one or more of Aspects 13-24.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An apparatus for wireless communication at a user equipment (UE), comprising:
   one or more memories; and
   one or more processors, based at least in part on information stored in the one or more memories, configured to:
      transmit an indication of a multi-level coding (MLC) capability for uplink transmissions; and
      receive a configuration of a selected MLC scheme associated with multiple MLC levels, wherein the configuration is based at least in part on the indication of the MLC capability for the uplink transmissions, wherein the configuration indicates a code rate associated with each MLC level of the multiple MLC levels, and wherein the code rate corresponds to a number of raw data bits divided by a total number of bits in an encoded data stream.

2. The apparatus of claim 1, wherein the selected MLC scheme corresponds to an uplink transmission associated with a sub-terahertz frequency band.

3. The apparatus of claim 1, wherein the indication of the MLC capability for the uplink transmissions indicates one or more supported MLC schemes.

4. The apparatus of claim 3, wherein the one or more supported MLC schemes include at least one of a multi-stage decoding MLC scheme or a parallel independent decoding MLC scheme.

5. The apparatus of claim 1, wherein the indication of the MLC capability for the uplink transmissions indicates a number of supported MLC levels.

6. The apparatus of claim 1, wherein an error protection scheme associated with a first MLC level of the multiple MLC levels is different than an error protection scheme associated with a second MLC level of the multiple MLC levels, wherein the first MLC level is associated with low density parity check coding, and wherein the second MLC level is uncoded or associated with Reed-Solomon coding.

7. The apparatus of claim 1, wherein the one or more processors are further configured to transmit an indication of one or more recommended MLC parameters associated with the selected MLC scheme.

8. The apparatus of claim 7, wherein the one or more recommended MLC parameters include at least one of:
- a recommended number of bits associated with each MLC level of the multiple MLC levels,
- a recommended code rate associated with each MLC level of the multiple MLC levels,
- a recommended modulation type associated with each MLC level of the multiple MLC levels, or
- a recommended MLC scheme.

9. The apparatus of claim 7, wherein the one or more recommended MLC parameters are based at least in part on at least one of:
- a measurement associated with a channel state information reference signal associated with a channel,
- a computation of decoding probabilities associated with the channel,
- a signal-to-noise ratio associated with the channel,
- a delay spread associated with the channel,
- a Doppler shift associated with the channel, or
- information associated with impairments at the UE.

10. The apparatus of claim 1, wherein the selected MLC scheme is associated with at least one of:
- a multi-stage decoding MLC scheme,
- a parallel independent decoding MLC scheme,
- a quadrature amplitude modulation (QAM) modulation and coding scheme (MCS), or
- an amplitude and phase-shift keying MCS.

11. An apparatus for wireless communication at a network node, comprising:
- one or more memories; and
- one or more processors, based at least in part on information stored in the one or more memories, configured to:
  - receive an indication of a multi-level coding (MLC) capability for uplink transmissions; and
  - transmit a configuration of a selected MLC scheme associated with multiple MLC levels, wherein the configuration is based at least in part on the indication of the MLC capability for the uplink transmissions, wherein the configuration indicates a code rate associated with each MLC level of the multiple MLC levels, and wherein the code rate corresponds to a number of raw data bits divided by a total number of bits in an encoded data stream.

12. The apparatus of claim 11, wherein the selected MLC scheme corresponds to an uplink transmission associated with a sub-terahertz frequency band.

13. The apparatus of claim 11, wherein the indication of the MLC capability for the uplink transmissions indicates one or more supported MLC schemes.

14. The apparatus of claim 13, wherein the one or more supported MLC schemes include at least one of a multi-stage decoding MLC scheme or a parallel independent decoding MLC scheme.

15. The apparatus of claim 11, wherein the indication of the MLC capability for the uplink transmissions indicates a number of supported MLC levels.

16. The apparatus of claim 11, wherein an error protection scheme associated with a first MLC level of the multiple MLC levels is different than an error protection scheme associated with a second MLC level of the multiple MLC levels, wherein the first MLC level is associated with low density parity check coding, and wherein the second MLC level is uncoded or associated with Reed-Solomon coding.

17. The apparatus of claim 11, wherein the one or more processors are further configured to receive an indication of one or more recommended MLC parameters associated with the selected MLC scheme.

18. The apparatus of claim 17, wherein the one or more recommended MLC parameters include at least one of:
- a recommended number of bits associated with each MLC level of the multiple MLC levels,
- a recommended code rate associated with each MLC level of the multiple MLC levels,
- a recommended modulation type associated with each MLC level of the multiple MLC levels, or
- a recommended MLC scheme.

19. The apparatus of claim 17, wherein the one or more recommended MLC parameters are based at least in part on at least one of:
- a measurement associated with a channel state information reference signal associated with a channel,
- a computation of decoding probabilities associated with the channel,
- a signal-to-noise ratio associated with the channel,
- a delay spread associated with the channel,
- a Doppler shift associated with the channel, or
- information associated with impairments at a network device.

20. The apparatus of claim 11, wherein the selected MLC scheme is associated with at least one of:
- a multi-stage decoding MLC scheme,
- a parallel independent decoding MLC scheme,
- a quadrature amplitude modulation (QAM) modulation and coding scheme (MCS), or
- an amplitude and phase-shift keying MCS.

21. A method of wireless communication performed by a user equipment (UE), comprising:
- transmitting an indication of a multi-level coding (MLC) capability for uplink transmissions; and
- receiving a configuration of a selected MLC scheme associated with multiple MLC levels, wherein the configuration is based at least in part on the indication of the MLC capability for the uplink transmissions, wherein the configuration indicates a code rate associated with each MLC level of the multiple MLC levels, and wherein the code rate corresponds to a number of raw data bits divided by a total number of bits in an encoded data stream.

22. The method of claim 21, wherein the selected MLC scheme corresponds to an uplink transmission associated with a sub-terahertz frequency band.

23. The method of claim 21, wherein the indication of the MLC capability for the uplink transmissions indicates one or more supported MLC schemes.

24. The method of claim 23, wherein the one or more supported MLC schemes include at least one of a multi-stage decoding MLC scheme or a parallel independent decoding MLC scheme.

25. The method of claim 21, wherein the indication of the MLC capability for the uplink transmissions indicates a number of supported MLC levels.

26. The method of claim 21, wherein an error protection scheme associated with a first MLC level of the multiple MLC levels is different than an error protection scheme associated with a second MLC level of the multiple MLC levels, wherein the first MLC level is associated with low density parity check coding, and wherein the second MLC level is uncoded or associated with Reed-Solomon coding.

27. A method of wireless communication performed by a network node, comprising:

receiving an indication of a multi-level coding (MLC) capability for uplink transmissions; and transmitting a configuration of a selected MLC scheme associated with multiple MLC levels, wherein the configuration is based at least in part on the indication of the MLC capability for the uplink transmissions, wherein the configuration indicates a code rate associated with each MLC level of the multiple MLC levels, and wherein the code rate corresponds to a number of raw data bits divided by a total number of bits in an encoded data stream.

28. The method of claim 27, wherein the selected MLC scheme corresponds to an uplink transmission associated with a sub-terahertz frequency band.

29. The method of claim 27, further comprising:
receiving an encoded uplink communication based at least in part on the selected MLC scheme.

30. The method of claim 27, further comprising:
receiving an indication of one or more recommended MLC parameters associated with the selected MLC scheme.

* * * * *